(12) United States Patent
Kono

(10) Patent No.: US 6,392,944 B1
(45) Date of Patent: May 21, 2002

(54) SEMICONDUCTOR MEMORY DEVICE CAPABLE OF PERFORMING STABLE SENSING OPERATION EVEN UNDER LOW POWER SUPPLY VOLTAGE ENVIRONMENT

(75) Inventor: Takashi Kono, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/985,283

(22) Filed: Nov. 2, 2001

(30) Foreign Application Priority Data

Feb. 5, 2001 (JP) .................................. 2001-027978

(51) Int. Cl.⁷ .................................................. G11C 7/08
(52) U.S. Cl. .................. 365/208; 365/190; 365/227; 365/228; 365/226; 365/196; 365/51; 365/189.09; 327/57; 327/51
(58) Field of Search ............................... 365/207, 208, 365/190, 227, 228, 226, 196, 195, 189.09, 51; 327/54, 55, 57, 51

(56) References Cited

U.S. PATENT DOCUMENTS

| | | | |
|---|---|---|---|
| 4,954,877 A | * 9/1990 | Nakanishi et al. | 257/659 |
| 5,666,074 A | * 9/1997 | Chun | 327/51 |
| 5,804,969 A | * 9/1998 | Lian et al. | 324/318 |
| 5,805,494 A | * 9/1998 | El-Kareh et al. | 365/149 |
| 6,087,885 A | * 7/2000 | Tobita | 327/379 |
| 6,091,648 A | 7/2000 | Furutani et al. | 365/189.11 |
| 6,195,298 B1 | 2/2001 | Furutani et al. | 365/189.11 |

FOREIGN PATENT DOCUMENTS

| | | | |
|---|---|---|---|
| JP | 06-215571 | 8/1994 | ......... G11C/11/409 |
| JP | 11-250665 | 9/1999 | ......... G11C/11/409 |

OTHER PUBLICATIONS

Takashi Kon, Takeshi Hamamoto, Katsuyoshi Mitsui, and Yasuhiro Konishi, "A Precharged–Capacitor–Assisted Sensing (PCAS) Scheme With Novel Level Controller For Low Power Drams," Symposium on VLSI Circuits Digest Of Technical Papers, 1999, pp. 123–124.

* cited by examiner

Primary Examiner—Andrew Q. Tran
(74) Attorney, Agent, or Firm—McDermott, Will & Emery

(57) ABSTRACT

A semiconductor memory device includes two power feed lines. An overdriving scheme is applied to one of the power feed lines in the sensing amplifying operation, and no overdriving scheme is applied to the other power feed line in the sensing operation. According to the overdriving scheme, the power feed line is overdriven to a potential level higher than a potential corresponding high level data stored in a memory cell. Thus, the overdriving of the power feed line is applied as an auxiliary function to prevent application of an excess potential to a memory cell capacitor. Such a semiconductor memory device can be achieved that improves both the speed of sensing amplifying operation and the reliability of memory cell capacitors, while conforming to low voltage operation requirement.

19 Claims, 17 Drawing Sheets

US 6,392,944 B1

SEMICONDUCTOR MEMORY DEVICE CAPABLE OF PERFORMING STABLE SENSING OPERATION EVEN UNDER LOW POWER SUPPLY VOLTAGE ENVIRONMENT

BACKGROUND OF THE INVENTION

1. Field of the Invention

The present invention relates to a semiconductor memory device including a sense amplifier that senses and amplifies potential differences between paired bit lines. Particularly, the invention relates to a sense power supply structure for stably driving a sense amplifier even under a low supply voltage condition.

2. Description of the Background Art

With advances in integration degree of semiconductor memory devices, there arise the problems such as increase in power consumption, and reduction in break down voltage characteristics of the components due to miniaturization. To overcome these problems, a method of reducing an operational power voltage has been developed. For example, an insulating film forming a capacitor of a memory cell in a dynamic random access memory (DRAM) is miniaturized to be a significantly thin film. In view of reliability, potential difference to be applied across the insulating film needs to be reduced, and the method to reduce the operational power voltage is adopted as a countermeasure against such situation. Recently, the reduction in operational power voltage is remarkably progressed. On the other hand, the reduction in the operational power voltage is in a reverse technical direction in view of improvement in the operational characteristics such as sensing operation margin and speed.

FIG. 1 is a circuit diagram of a conventional semiconductor memory device, and particularly shows a configuration of a DRAM memory array. In the memory array, memory cells MC are arranged in rows and columns, word lines WL are disposed corresponding to respective rows of the memory cells MC, and the pairs of bit lines BL and ZBL are disposed corresponding to the respective columns of the memory cells MC. FIG. 1 depicts a configuration of a portion related to a single pair of bit lines BL and ZBL.

The memory cell MC includes a capacitor CM for storing data and an access transistor TRM for connecting the capacitor to the bit line BL in response to a potential on the corresponding word line WL. The access transistor TRM is formed of an n-channel MOS (insulated gate type field effect) transistor. The memory cell capacitor CM receives a predetermined cell-plate voltage Vcp on one electrode node (cell plate node), and stores charge corresponding to stored data on the other electrode SN (storage node). The memory cell MC is connected to one of the corresponding bit lines BL and ZBL, and is shown to be connected to the bit line BL in FIG. 1.

Corresponding to the pair of bit lines BL and ZBL, a sense amplifier SA and an bit-line equalize circuit EQ are provided. The sense amplifier SA senses and amplifies memory cell data. The bit line equalize circuit EQ precharges and equalizes the bit lines BL and ZBL to a predetermined potential in a standby state.

The sense amplifier SA includes cross-coupled p-channel MOS transistors SAP1 and SAP2 (sense transistors), and cross-coupled n-channel MOS transistors SAN1 and SAN2. The sense amplifier SA senses and amplifies a potential difference generated between the bit lines BL and ZBL when made active.

The sense transistor SAP1 is connected between the bit line BL and a node NP, and has the gate connected to the bit line ZBL. The sense transistor SAP2 is connected between the bit line ZBL and the node NP, and its gate is connected to the bit line BL. The sense transistor SAN1 is connected between the bit line BL and a node NN, and its gate is connected to the bit line ZBL. The sense transistor SAN2 is connected between the bit line ZBL and the node NN, and its gate is connected to the bit line BL.

The sense amplifier SA is activated when a sense amplifier driving p-channel MOS transistor SDP and a sense amplifier driving n-channel MOS transistor SDN are each made conductive. The sense amplifier driving n-channel MOS transistor SDN is rendered conductive, in response to activation of a sense amplifier activating signal S0N, to electrically connect the source node NN of the sense transistors SAN1 and SAN2 to a sense power feed line VSL that feeds a ground potential GND. The sense amplifier driving transistor SDP is made conductive in response to activation of a sense amplifier activating signal ZS0P, and electrically connects the source node NP of the sense p-channel MOS transistors SAP1 and SAP2 to a power feed line VSH for transmitting a memory array power supply potential Vdds when made conductive.

A circuit formed including the sense amplifier SA, sense amplifier driving transistor SDN, and sense amplifier driving transistor SDP is hereinbelow referred to as a "sense amplifier/drive circuit SAD".

The bit line equalize circuit EQ precharges and equalizes the bit lines BL and ZBL to an equalization potential Vbl according to an equalizing signal on an equalizing signal line BLEQ. The bit line equalize circuit includes a precharging transistor for transmitting the equalization potential Vbl to the bit lines, and an equalizing transistor for electrically short-circuiting the bit lines BL and ZBL with each other.

The power feed line VSH, which feeds the sense power voltage Vdds (memory array power supply potential), is connected to an internal voltage down converting circuit VDC. The voltage down converting circuit VDC down-converts an external power potential extVdd, and provides a sense amplifier driving power source at the memory array power potential Vdds.

FIG. 2 is a timing chart representing the operation of the sense amplifier SA shown in FIG. 1. Before a time T01, specifically, before the word line WL is selected to rise in potential, both the bit line BL and bit line ZBL are precharged to a precharge or equalization potential Vbl. Here, the precharge potential Vbl is assumed to be Vdds/2, or the intermediate potential of the memory array power potential Vdds and the ground potential GND. Also, the memory cell MC is assumed to store H data (logical high level data).

At time T01, the word line WL rises in potential, the H data stored in the memory cell MC is read out onto the bit line BL, and a very small potential difference dV is produced between the bit lines BL and ZBL.

At time T02, the levels of the sense amplifier activating signals S0N and ZS0P become H and L levels, respectively; and the sense amplifier SA is activated. Through a sensing operation of the sense amplifier SA, the very small potential difference dV caused between the bit lines BL and ZBL is sensed and amplified. In this operation, since the access transistor TRM in the memory cell MC is conductive, the potential Vdds of the higher potential power feed line VSH is applied through the bit line BL and the transistor TRM to the storage node SN, which is one electrode of the capacitor CM in the memory cell MC.

Here, a threshold voltage of each of the n-channel MOS transistors SAN1 and SAN2 is represented by Vthn, and a threshold voltage of each of the p-channel MOS transistors SAP1 and SAP2 is represented by Vthp.

For the sense amplifier SA to start sensing operation at time T02, gate to source potentials Vgs of the sense transistors SAN1, SAN2, SAP1, and SAP2 must be greater in absolute value than the threshold voltages Vthn and Vthp. When the very small potential difference dV between the bit lines BL and ZBL is disregarded, the following relationship is satisfied before the sensing operation:

$Vgs=Vbl=1/2 \times Vdds$.

When the following relationship holds, the sense amplifier SA securely starts sensing operation:

$Vdds > \max\{2 \times Vthn, 2 \times |Vthp|\}$.

When the following relationship holds, the sense amplifier SA does not start the sensing operation:

$Vdds < \min\{2 \times Vthn, 2 \times |Vthp|\}$.

In addition, one of the values of Vgs–Vthn and Vgs–|Vthp| significantly influences an initial speed of the sensing operation of the sense amplifier SA. When one of the values of Vgs–Vthn and Vgs–|Vthp| is reduced due to a reduction in the potential Vdds of the higher potential sense amplifier driving power feed line VSH, there is caused an increase in sense time, or a reduction in operation speed of the sense amplifier, and also shortage in sense operation margin against variations in the threshold voltages Vthn and Vthp of the transistors due to variations in processing.

In addition, as shown in FIG. 2, the potentials of the power feed lines VSH and VSL vary according to charging/discharging of the bit lines in sensing operation. Immediately after the start of a sensing operation of the sense amplifier SA at time T03, the potentials of the power feed lines VSH and VSL greatly vary according to charging/discharging of the bit lines BL and ZBL due to the sensing operation of sense amplifier SA. Particularly, the degree of the variation in the potential of the higher potential power feed line VSH, that is, the degree of reduction in the potential thereof, depends on factors, such as a resistance and capacitance of interconnection line of the higher potential power feed line VSH, and the speed of response to potential variation of the voltage down converting circuit VDC. In addition, in conjunction with an increase in potential of the lower potential power feed line VSL, such potential variation would cause significant reduction in the operation speed of the sense amplifier SA, and would eventually cause a malfunction.

An overdriving scheme is proposed to solve the problem, as described above, of shortage in sensing operation margin that is caused due to the reduction in potential of a higher potential power feed line for feeding the higher potential power potential to the sense amplifier SA. An example of the overdriving scheme is disclosed in Japanese Patent Laying-Open Nos. 11-250665 (1999) and 6-215571 (1994); and 1999 Symposium on VLSI Circuits, Digest of Technical Papers, pp. 123 to 124.

FIG. 3 shows a configuration of a circuit for feeding a power potential to a higher potential power feed line of a sense amplifier in an overdriving scheme disclosed, for example, in the above described Japanese Patent Laying-Open No. 11-250655 (1999). Referring to FIG. 3, in order to feed the power supply voltage VSH to the sense amplifier driving circuit SAD, there are provided a voltage down converting circuit 40a for generating a down converted voltage from an external power supply voltage extVdd onto a high level power feed line VSH, and a precharging p-channel MOS transistor P1 for feeding a potential Vddp on an internal power node to the high level power feed line VSH when rendered conductive. The precharging transistor P1 is selectively rendered conductive in response to a signal output by an inverter 45 which in turn receives a precharge signal PRE representing an inactivation of row related circuitry for inversion. The power feed line VSH is connected with a decoupling capacitor Cd.

The voltage down converting circuit 40a includes a reference potential generator circuit 41a for generating two reference potentials Vrefp and Vrefs, a selector 42, a shifter 43, a comparison circuit 44a, and a p-channel transistor P0. The selector 42 selects the reference potential Vrefp as a reference potential Vref when the precharge signal PRE is at an H level, while selects the reference potential Vrefs as the reference potential Vref when the precharge signal PRE is at an L level. The shifter 43 shifts the reference potential Vref selected by the selector 42 and the potential of the high level power feed line VSH. The comparison circuit 44a compares the potential applied through the shifter 43 on the power feed line VSH and the reference potential Vref selected by the selector 42. The p-channel transistor P0 is connected between a node of the external power potential extVdd and the high level power feed line VSH, and receives an output of the comparison circuit 44a on a gate thereof. The shifter 43 is provided for optimizing the operating point of the comparison circuit 44a to increase the gain of the comparison circuit 44a.

FIG. 4 is a timing chart representing operation of the circuit that feeds the power potential to the higher potential power feed line for driving the sense amplifier according to the overdriving scheme as shown in FIG. 3. In FIG. 4, GND represents a ground potential; Vddp represents a power potential mainly for a peripheral circuit including a control circuit in a DRAM; Vdds represents a power potential mainly for a memory array and sense amplifier circuit; and Vpp represents boosted potential used as, for example, a word line driving potential. These potentials satisfy the the relationship of GND<Vdds<Vddp<Vpp. Hereinafter, Vdds is referred to as a memory array power potential, and Vddp is referred to as a peripheral circuit power potential. The two reference potentials generated from the reference potential generator circuit 40a satisfy the relationships of Vrefp=Vddp and Vrefs=Vdds.

In the standby state, that is, before time T10, the precharge signal PRE is at an H level. Accordingly, out of the reference potentials Vrefp and Vrefs generated from reference potential generator circuit 41a, the selector 42 shown in FIG. 3 selects the reference potential Vrefp as the reference potential Vref. The comparison circuit 44a receives the reference potential Vrefp and the potential of the power feed line VSH through the shifter 43, compares the received two potentials, and adjusts a gate potential of the p-channel transistor P0 so as to equalize the received two potentials to each other. The p-channel transistor P0 has a conductance thereof according to its gate potential, to feed charge from the node of the external power potential extVdd to the high level power feed line VSH.

The precharging p-channel transistor P1 becomes conductive, according to an output signal of the inverter 45 that receives the precharge signal PRE, to feed charge from the node of the peripheral circuit power potential Vddp to the power feed line VSH. According to the charge from the p-channel transistor P0 and the precharging p-channel MOS transistor P1, the power feed line VSH and the decoupling capacitor Cd are charged to the peripheral circuit power potential Vddp.

At time T10, the precharge signal PRE falls to an L level. Responsively, the selector 42 in the voltage down converting circuit 40a selects the reference potential Vrefs to switch the reference potential Vref from the reference potential Vrefp to the reference potential Vrefs. On the other hand, the precharging p-channel transistor P1 receives an H-level signal on its gate, and is responsively driven to a nonconductive state. That is, at this time, feeding of charge from the node of the peripheral circuit power potential Vddp to the power feed line VSH and the decoupling capacitor Cd is stopped.

At time T11, a word line WL is selected, and the potential thereof starts to rise up to the level of the boosted potential Vpp. Responsively, the access transistor TRM of a memory cell MC is rendered conductive, charge retained in the memory cell MC is transferred to a bit line BL, and a very small potential difference dV is caused between bit lines BL and ZBL.

At time T12, sense amplifier activating signals ZS0P and S0N are each activated, and a sense amplifier SA senses and amplifies the very small potential difference dV, which has been generated between the bit lines BL and ZBL. The capacitance value of the decoupling capacitor Cd is pre-set such that charge required for charging the bit line BL that swings to H data (=Vdds) is compensated for by charge pre-accumulated in the decoupling capacitor Cd. Thus, after the amplification by the sense amplifier SA, the potential of the bit line BL and the potential of the power feed line VSH can be made equal to memory array power potential Vdds. When the potential of the power feed line VSH is reduced to or below the memory array power potential Vdds, the voltage down converting circuit 40a operates to feed charge to maintain the potential of the power feed line VSH at the level of memory array power potential Vdds.

The conventional semiconductor memory device shown in FIG. 3 is advantageous in that gate to source potentials Vgs of the p-channel sense transistors SAP1 and SAP2 in the sense amplifier SA are increased from the level of 1/2×Vdds to the level of the potential Vddp−1/2×Vdds, or increased by the potential of Vddp−Vdds. However, due to a great trend of reduction in operation voltage of the semiconductor memory device, a case may occur where the potential extVdd is equaled to the potential Vddp (extVdd=Vddp). Specifically, a case can occur where the specification value of the external power potential extVdd becomes lower, and there is almost no potential difference between the external power potential extVdd and the peripheral circuit power potential Vddp. Therefore, there is no need to reduce the external power potential extVdd to produce the peripheral circuit power potential Vddp within the semiconductor memory device. In such a case, the source side of the precharging p-channel transistor P1 is configured to be connected to the node of the external power potential extVdd instead of a node of the power potential Vddp internally generated.

FIG. 5 shows a configuration of a circuit for feeding a power potential to a higher potential power feed line for driving the sense amplifier according to the overdriving scheme disclosed in the Japanese Patent Laying-Open No. 1994-215571, as an example of a configuration in which the source of a precharging p-channel transistor is connected to the node of an external power potential extVdd to charge the decoupling capacitor Cd.

Referring to FIG. 5, a power feed line VSH for a sense amplifier/driver circuit SAD is connected with a voltage down converting circuit 40b, a precharging p-channel transistor P2, and the decoupling capacitor Cd. The voltage down converting circuit 40b down converts an external power potential extVdd, to generate a memory array power potential Vdds on the power feed line VSH. The precharging p-channel transistor P2 is connected between the node of the external power potential extVdd and the power feed line VSH, and receives an overdrive instructing signal φ on its gate.

The voltage down converting circuit 40b includes a reference potential generator circuit 41b, a comparison circuit 44b, and a p-channel transistor P0. The reference potential generator circuit 41b generates a reference potential Vrefs. The comparison circuit 44b compares a potential of the power feed line VSH and the reference potential Vref. The p-channel transistor P0 is connected between the node of the external power potential extVdd and the power feed line VSH, and receives an output of the comparison circuit 44b on its gate.

FIG. 6 is a timing chart representing the operation of the circuit that feeds the power potential to the higher level power feed line for the sense amplifier in the overdriving scheme shown in FIG. 5. In FIG. 6, the represented potentials are assumed to satisfy the relationships similar to those shown in FIG. 4.

Before a time T21, charge is fed from the node of the external power potential extVdd to the power feed line VSH through the p-channel transistor P0 so as to equalize the reference potential Vrefs generated from reference potential generator circuit 41b and the potential of the power feed line VSH to each other. Since the overdriving instructing signal φ applied to the gate of the precharging p-channel transistor P2 is at an L level, the precharging p-channel transistor P2 is in a conductive state, and charge is also fed to the power feed line VSH from the node of the external power potential extVdd via the precharging p-channel transistor P2. When the potential of the power feed line VSH is increased to or above the memory array power potential, the voltage down converting circuit 40b sets the p-channel transistor P0 to be in a nonconductive state. Therefore, the decoupling capacitor Cd is charged to the potential extVdd by the precharging p-channel transistor P2.

At time T21, a word line WL is selected, and its potential starts to rise up to the level of the boosted voltage Vpp. Charge retained in the memory cell MC is transferred to a bit line BL, and a very small potential difference dV is generated between the bit lines BL and ZBL.

At time T22, sense amplifier activating signals ZS0P and S0N are each activated, and a sense amplifier SA senses and amplifies the very small potential difference dV. Charge required for charging the bit line BL that swings to the H data level (=Vdds) in the sensing operation is compensated for by charge pre-accumulated in the decoupling capacitor Cd. At the time T22, since the overdrive instructing signal φ is at the L level, charge is continuously fed from the node of the external power potential extVdd to the power feed line VSH and to the decoupling capacitor Cd. Thus, the charge required to charge the bit line BL that swings to the H data level (=Vdds) is directly fed from the node of the external power potential extVdd.

At time T24, the level of the overdrive instructing signal φ transits to an H level, to turn off the precharging p-channel transistor P2, thereby stopping the supply of charge from the node of the external power potential extVdd to the power feed line VSH and the decoupling capacitor Cd.

When the precharging p-channel transistor P2 stops charging to the power feed line VSH and the decoupling capacitor Cd, the potentials of the power feed line VSH and the bit line BL change to the memory array power potential Vdds according to charging/discharging of the bit lines BL and ZBL.

The period from the time T22 to the time T24 is a so-called initial sensing amplifier operation stage. This initial operation stage is an important stage in which the sensing operation speed and sensitivity of the sensing are determined. Charge is supplemented to the power feed line VSH in the period before the initial stage via the precharging p-channel transistor P2 to intend to improve the sensing operation speed, particularly, in the initial sensing operation stage.

The capacitance value of the decoupling capacitor Cd shown in FIGS. 3 and 5 is predetermined by means of simulation for example, to satisfy the following relationship:

$$Cd \times (Vdp-Vdds) = Cba \times Vbl,$$

where Cba represents a total load amount of all bit lines BL and ZBL subjected to sensing operation, and Vdp represents the precharge potential before starting of the sensing operation of power feed line VSH.

Generally, the potential of an external power supply of a semiconductor memory device is defined by specifications. For example, for a DRAM, the external power supply potential is specified to be in the range of 3.3 V±0.3 V. When the potential is within the specified range, potential variations of about 10% is permitted to guarantee the operation performance. As shown in FIGS. 3 and 5, the conventional semiconductor memory device is configured such that the decoupling capacitor Cd is charged by the external power source, and as a result, ±10% variations in the external power potential lead to ±10% variations in the precharge potential of the decoupling capacitor Cd.

As described above, the capacitance value of the decoupling capacitor Cd is set through simulation or the like. However, if the external power potential extVdd varies to a minus side, the precharge potential Vdp is accordingly reduced to cause inadequate charging of the decoupling capacitor Cd. In this case, sufficient gate to source potential Vgs of each of the p-channel sense transistor SAP1 and SAP2 in the sense amplifier SA cannot be secured, thereby causing slow down and margin shortage in the sensing operation. If the external power potential extVdd varies to a plus side, the precharge potential Vdp is increased to cause overcharging to the power feed line VSH and the decoupling capacitor Cd. In this case, since excessive charge is fed to the bit line BL, a problem may arise that the potential fed to the memory cell MC is excessively increased unnecessarily. Specifically, an excessively high potential is applied to an electrode on the side of the bit line BL, i.e., the storage node SN, of the capacitor CM in the memory cell MC, thereby significantly affecting the reliability of the break down voltage characteristics of an insulating film. Particularly, in the configuration shown in FIG. 5, the precharging p-channel transistor P2 is still conductive in the initial sensing/amplifying operation stage, or in the period from the time T22 to the time T24. In this case, there is a significantly high probability that variations in the external power voltage directly influence the insulating film in the memory cell MC.

In the conventional semiconductor memory device configured as described above, the precharge potentials of the higher potential power feed line and the decoupling capacitor are variable according to variations in the predetermined allowable power supply potential. Therefore, if the precharge potential and the capacitance value of the decoupling capacitor are set without taking the variations in the predetermined power supply potential into account, the application of an excessive voltage caused due to the variation in the predetermined power supply potential to the insulating film of the memory cell cannot be prevented.

If the precharge potential and capacitance value of the decoupling capacitor are set so as to assure sufficient sensing operation speed and sensing operation margin with changes of the predetermined power potential to the minus side considered, the possibility is further increased that an excess voltage is applied to the insulating film of the memory cell, which is caused by the changes of the predetermined power supply potential. That is, as the countermeasure against the minus side variation of the external power supply potential, the precharge potential of the power feed line is set higher, or the capacitor value of the decoupling capacitor is made greater. If the predetermined power potential tends to change to the plus side in such condition, an excess charge is supplied to the storage node of the memory via a bit line.

In contrast, when the precharge potential and the capacitance value of the decoupling capacitor are appropriately set to prevent the application of excessive potential to the insulating film of the memory cell, taking the variations to the plus side of the predetermined power potential into account, there would occur shortage in power supply, slow down in sensing operation, shortage in sensing operation margin, and further, reduction in the potential of the power feed line as well. Because of presence of the tolerance for the predetermined power supply potential, a problem arises that it is significantly difficult to determine an appropriate capacitance value of the decoupling capacitor.

SUMMARY OF THE INVENTION

It is an object of the present invention to provide a semiconductor memory device that realizes both the speed up of the sensing operation and improvement in the reliability of a memory cell capacitor, coping with reduced power supply voltage level.

Another object of the invention is to provide a semiconductor memory device that allows setting of an appropriate decoupling capacitance value without being influenced by variations in a specification-guaranteed potential of a predetermined power supply.

Still another object of the present invention is to provide a semiconductor memory device capable of performing high speed sensing operation even at a low power supply voltage without impairing the reliability in a memory cell insulating film.

A semiconductor memory device according to an aspect of the present invention includes: a pair of bit lines; a memory cell connected to one of the paired bit lines; a sense amplifier for sensing and amplifying a potential difference of the paired bit lines that is caused in accordance with data read from the memory cell; a first power feed line for feeding a higher potential driving power to the sense amplifier; a second power feed line for feeding a higher potential driving power to the sense amplifier; a first sense amplifier driving transistor connected between the first power feed line and the sense amplifier; a second sense amplifier driving transistor connected between the second power feed line and the sense amplifier; a first decoupling capacitor connected between the first power feed line and a ground potential source; a second decoupling capacitor connected between the second power feed line and the ground potential source; a first power feed circuit for precharging the first power feed line and the first decoupling capacitor to a first potential prior to activation of the sense amplifier; and a second power feed circuit for charging the second power feed line and the second decoupling capacitor to a second potential lower than the first potential.

According to another aspect of the invention, a semiconductor memory device includes: a pair of bit lines; a memory cell connected to one of the bit lines in the pair; a sense amplifier for sensing and amplifying a potential difference of the paired bit lines that is caused in accordance with data read from the memory cell; a power feed line for feeding a higher potential driving power to the sense amplifier; a sense amplifier driving transistor connected between the power feed line and the sense amplifier; constant decoupling capacitor connected between power feed line and a ground potential source with fixed capacitance value; a variable decoupling capacitor connected to the power feed line and having a decoupling capacitance value thereof varied in response to a control signal; a charging circuit for charging the power feed line, the constant decoupling capacitor, and the variable decoupling capacitor from a predetermined power supply; and a monitoring and controlling circuit for monitoring the potential of the predetermined power supply, outputting the control signal according to the result of monitoring, to control the capacitance value of the variable decoupling capacitor.

The two sense amplifier power feed lines mitigate the influence of the potential variation of the predetermined power supply, and implements the sense amplifier operation according to the overdriving scheme to prevent the slow down of the sensing operation at the initial sensing operation stage. In addition, the coupling of the two sense power feed lines mitigates the potential applied to the storage node of a memory cell.

The use of the constant and variable decoupling capacitor can allow an appropriate capacitance value to be set internally to cope with any variation of the predetermined power supply.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 7:
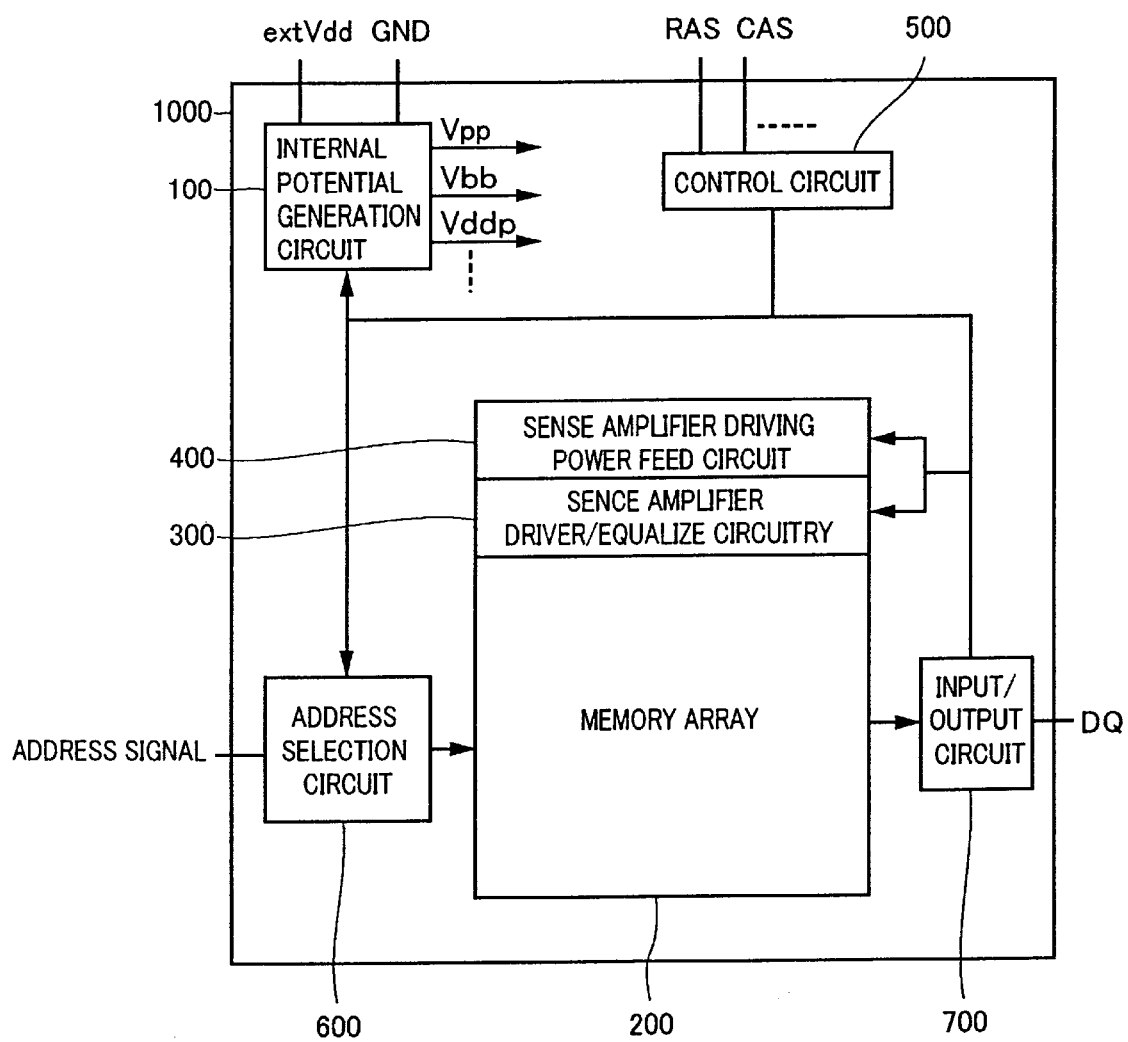
FIG. 7 is a block diagram showing a configuration of a DRAM according to a first embodiment of the present invention.

FIG. 7 is a block diagram schematically showing the overall configuration of a dynamic random access memory (DRAM) according to a first embodiment of the present invention. In FIG. 7, the DRAM 1000 includes an internal potential generation circuit 100, a memory array 200, sense amplifier driver/equalize circuitry 300, a sense amplifier driving power feed circuit 400, a control circuit 500, an address selection circuit 600, and an input/output circuit 700. The internal potential generation circuit 100 receives an external power potential extVdd, to generate various internal power potentials.

The memory array 200 includes a plurality of word lines, a plurality of paired bit lines, and memory cells disposed in rows and columns.

The sense amplifier driver/equalize circuitry 300 includes a sense amplifier that senses and amplifies charge retained in the memory cells. The power feed circuit 400 feeds sense amplifier driving power. The control circuit 500 receives various control signals such as a row address strobe signal RAS and a column address strobe signal CAS and controls the timings of various operations of the DRAM 1000.

The address selection circuit 600 selects a memory cell out of the memory cells disposed in the memory array 200 in response to an address signal. The input and output circuit 700 performs input/output operations for data communication between an external device and a memory cell selected by the address selection circuit 600.

If the DRAM 1000 is a clock synchronous memory and operates according to a command applied in synchronization with a clock signal, the control signal RAS and CAS, in combination with other control signal specify an operation mode of the DRAM. In a standard DRAM, a row address strobe signal RAS determines a memory cycle, and controls activation/deactivation of a selection operation for a memory cell row. On the other hand, the column address strobe signal CAS controls activation/deactivation of a selection operation for a memory cell column. The DRAM of the present embodiment may be either the clock synchronous memory or a clock asynchronous memory. The DRAM is at least required to contain a sense amplifier to sense, amplify and latch memory cell data read out on a bit line.

The internal potential generation circuit 100 generates a boosted Vpp used as word line driving potential, for example, a back gate potential Vbb mainly applied a substrate region where the memory array is formed, and a power supply potential Vddp mainly used for peripheral circuitry including a control circuit in the DRAM and such. Hereinbelow, the power potential Vddp for the peripheral circuitry is referred to as a "periphery power potential Vddp"; and the power supply potential Vdds primarily for the memory array, the sense amplifier circuit ,and others in the DRAM is referred to as a "memory array power potential Vdds".

Figure 8:
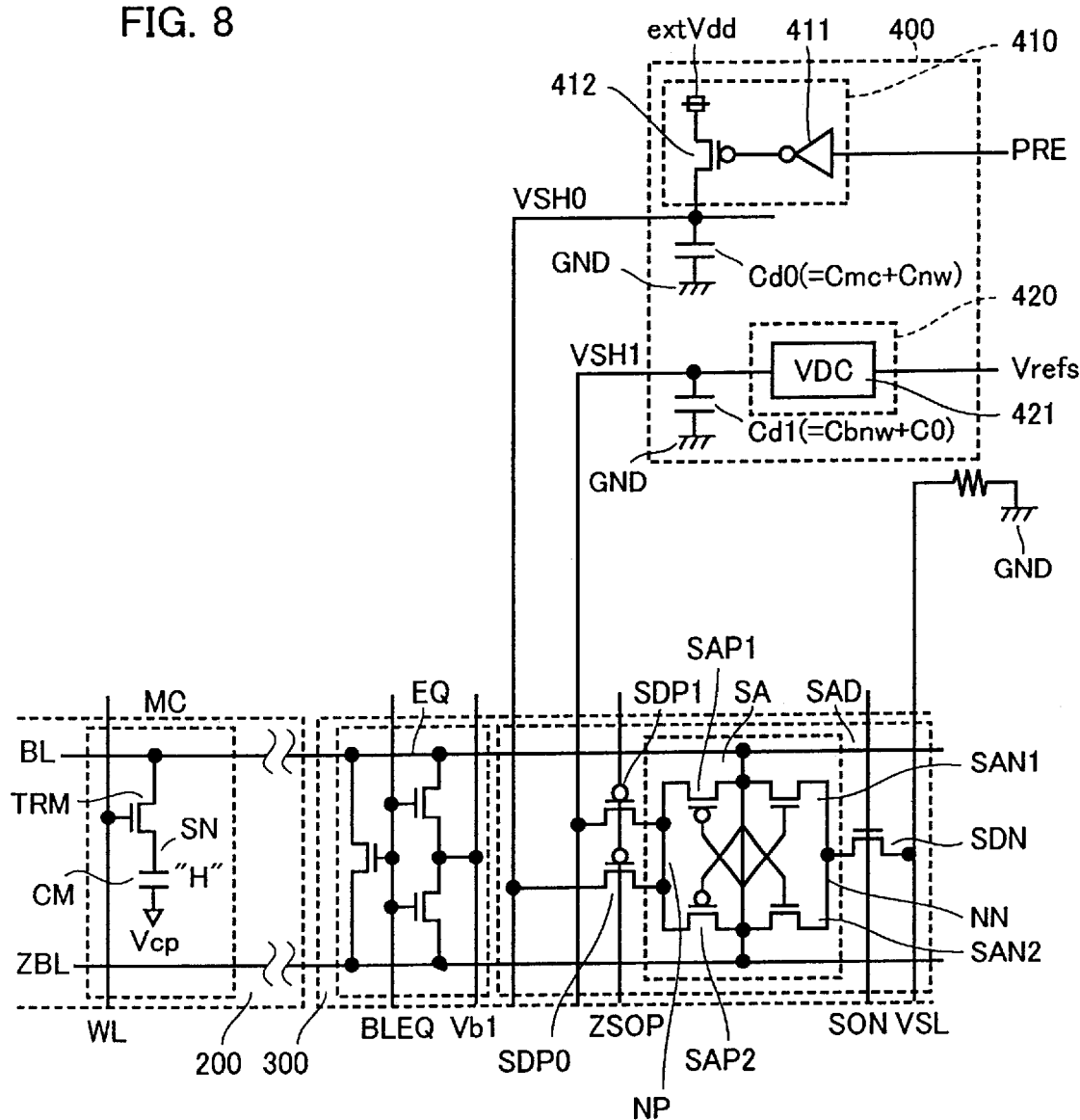
FIG. 8 is a circuit diagram showing configurations of a sense amplifier driving power feed circuit, sense amplifier driver/equalize circuitry, and a memory array that are shown in FIG. 7.

FIG. 8 is a circuit diagram showing a part of the configuration of the sense amplifier driving power feed circuit 400, the sense amplifier driver/equalize circuitry 300, and the memory array 200 shown in FIG. 7. Referring to FIG. 8, the same reference characters as those used in the conventional configuration denote identical or equivalent portions of the conventional device. In the first embodiment, two power feed lines that feed higher potential power potentials to a sense amplifier SA are used, and are first and second power feed lines VSH0 and VSH1.

A sense amplifier/drive circuit SAD includes: the sense amplifier SA of a cross coupled type, a sense amplifier driving n-channel transistor SDN connected between a low level power feed line VSL and the sense amplifier SA; a sense amplifier driving p-channel transistor SDP0 connected between the power feed line VSH0 and the sense amplifier SA; and a sense amplifier driving p-channel transistor SDP1 connected between the power feed line VSH1 and the sense amplifier SA.

The gates of the sense amplifier driving p-channel transistors SDP0 and SDP1 commonly receive the sense amplifier activating signal ZS0P. A sense source node NP is connected to the power feed lines VSH0 and VSH1 via the p-channel transistors SDP0 and SDP01, respectively. Another sense source node NN is connected to the low level power feed line VSL via the n-channel transistor SDN.

The sense amplifier SA includes an n-channel transistor SAN1 connected between a bit line BL and the node NN, an n-channel transistor SAN2 connected between a bit line ZBL and the node NN, a p-channel transistor SAP1 connected between the bit line BL and the node NP, and a p-channel transistor SAP2 connected between the bit line ZBL and the node NP.

The sense amplifier driving power feed circuit 400 includes: a decoupling capacitor Cd0 connected between the power feed line VSH0 and a ground node feeding a ground potential GND;, a first power feed circuit 410 for feeding charge to the power feed line VSH0 and the decoupling capacitor Cd0 in response to activation of a precharge signal PRE; a decoupling capacitor Cd1 connected between the power feed line VSH1 and a ground node; and a second power feed circuit 420 for generating the memory array power potential Vdds through down converting of the external power potential extVdd, to feed the potential Vdds to the power feed line VSH1. A so-called overdriving scheme is employed for the first power feed line VSH0 through the first power feed circuit 410, but is not employed for the second power feed line VSH1.

Following assumption is made for the following discussion. When the precharge signal PRE is at an H level, it represents inactivation of so-called row related circuitry in the DRAM. In a period when the precharge signal PRE is at the H level, the DRAM is in a standby state. In a period when the precharge signal PRE is at an L level, the DRAM is in a state where the row related circuitry is activated.

The first power feed circuit 410 includes an inverter 411 receiving and inverting the precharge signal PRE for outputting, and a precharging p-channel transistor 412 connected between a node of the external power potential extVdd and the power feed line VSH0, and receiving the output of the inverter 411 on a gate thereof.

The-second power feed circuit 420 includes a voltage down converting circuit 421 (VDC) for down converting the external power potential extVdd, to generate the memory array power potential Vdds for outputting.

A capacitance value of the decoupling capacitor Cd0 connected to the first power feed line VSH0 is set to a value that satisfies the following relationship when the external power potential extVdd varies at least in a range allowed on a specification;

$$Cd0 \times (Vdp - Vdds) < Cba \times Vbl.$$

The decoupling capacitor Cd0 stores charge corresponding in amount to charge consumed in an initial sensing amplifying operation stage of the sense amplifier. The decoupling capacitor Cd1, which is connected to the second power feed line VSH1, has a capacitance value set to substantially suppress transitional reduction of the potentials of the bit lines, and the power feed line VSH0 and VSH1 and others after the sense initial stage.

Figure 4:
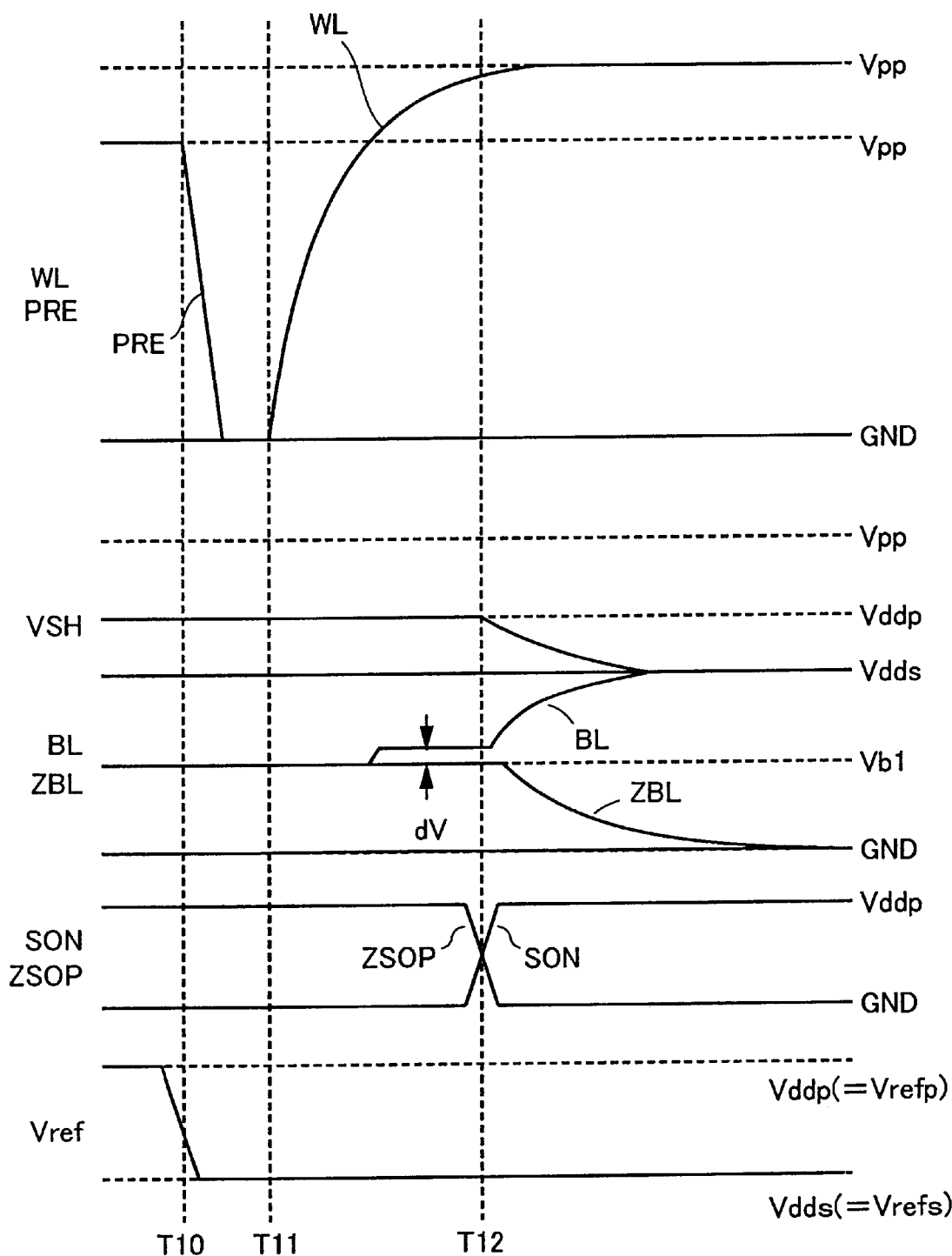
FIG. 4 is a timing chart representing an operation of a circuit that feeds power potential to the higher level power feed line for driving the sense amplifier in the conventional overdriving scheme shown in FIG. 3.
Figure 5:
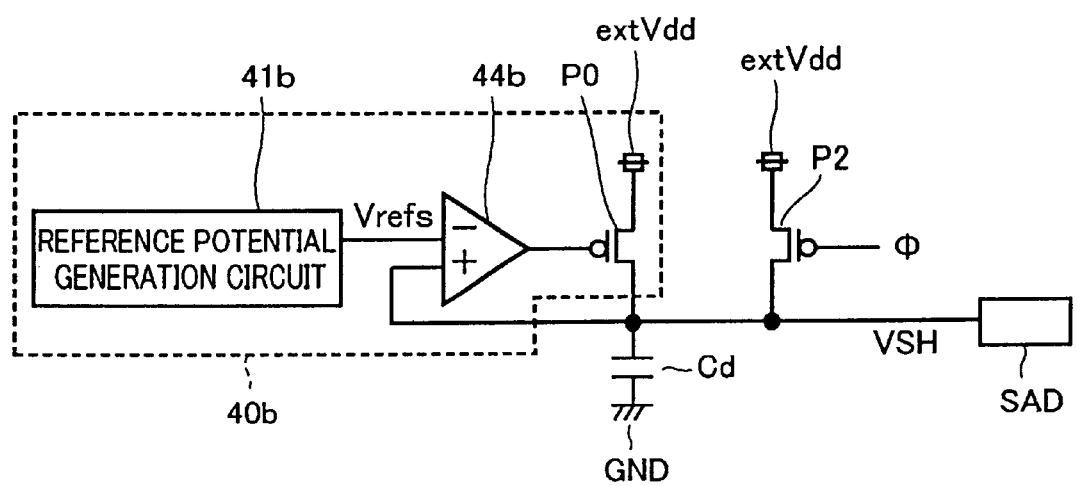
FIG. 5 is a circuit diagram showing a configuration of a circuit for feeding power potential to a conventional higher level power feed line for driving the sense amplifier according to the overdriving scheme.
Figure 6:
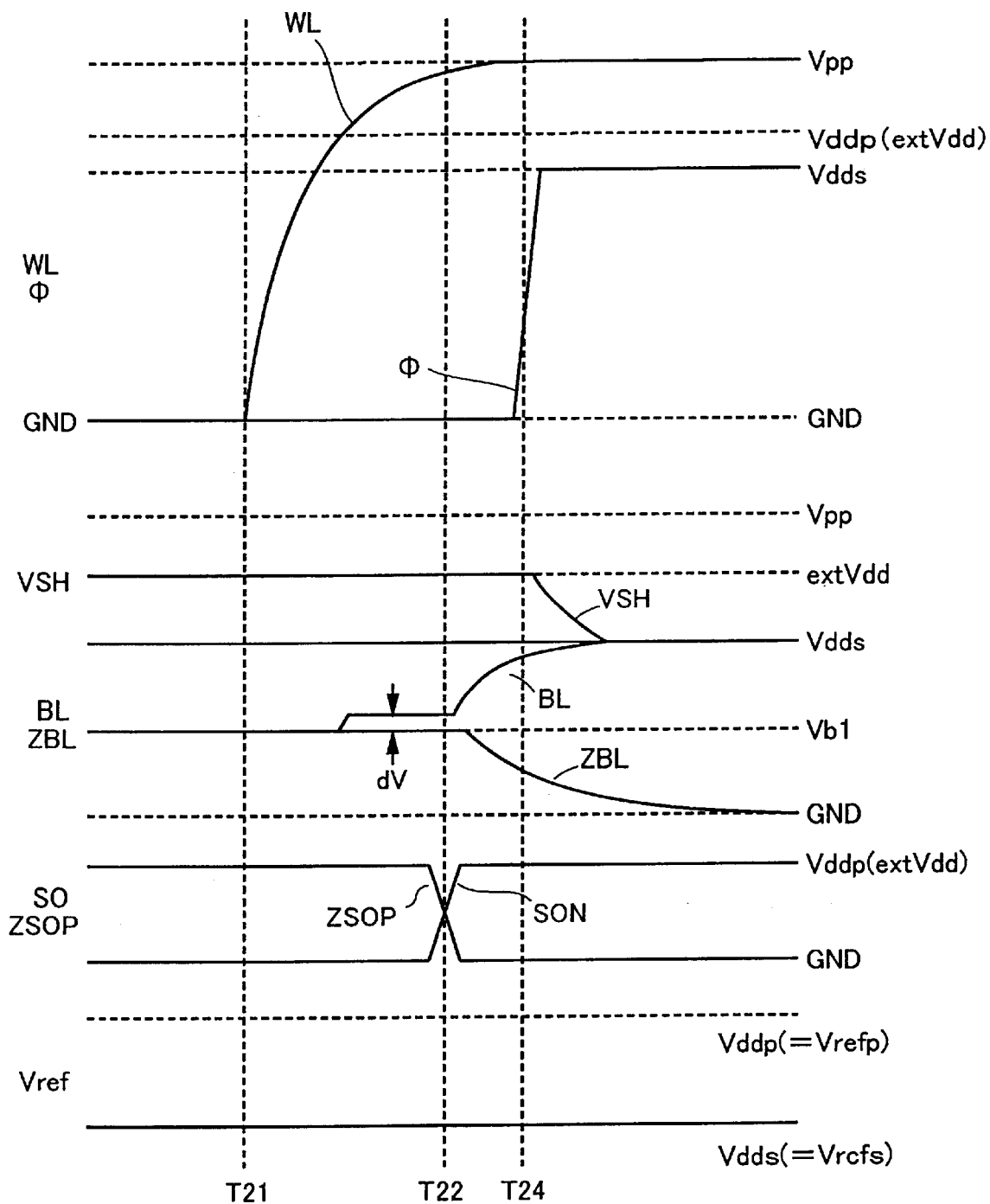
FIG. 6 is a timing chart representing operation of the circuit that feeds power potential to the higher level power feed line for driving the sense amplifier according to the overdriving scheme shown in FIG. 5.
Figure 9:
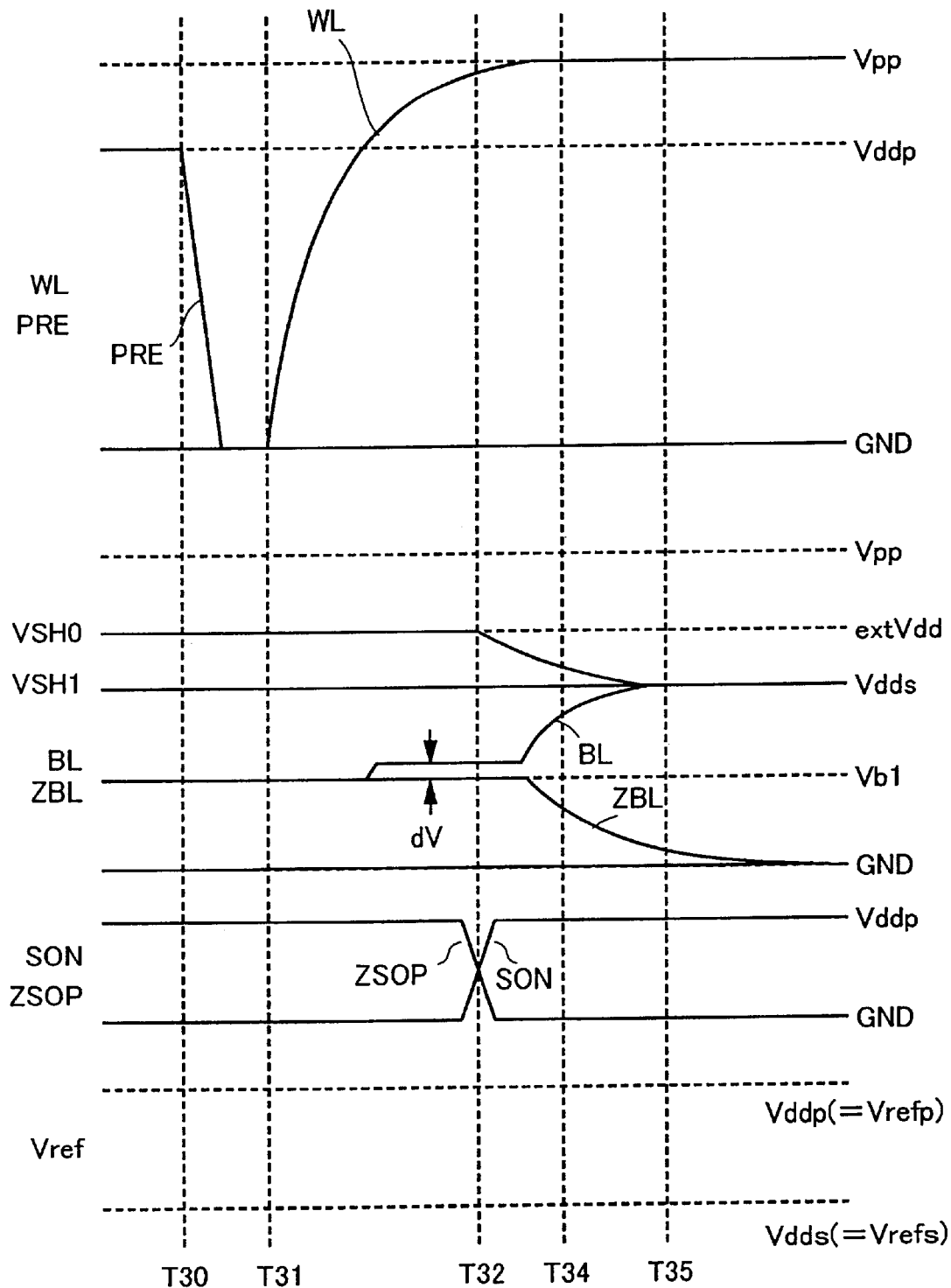
FIG. 9 is a timing chart representing operations of the sense amplifier driving power feed circuit and a sense amplifier/ driver circuit SAD as shown in FIG. 8.

FIG. 9 is a timing chart representing operations of the sense amplifier driving power feed circuit 400 and a sense amplifier driver circuit SAD as shown in FIG. 8. In FIG. 9, the relationships among the potentials are similar to those shown in FIG. 4.

Now, a description will be made referring to FIGS. 8 and 9. In a standby state, that is, before time T30, the voltage down converting circuit 421 operates to equalize a reference potential Vrefs fed from a reference potential generation circuit (not shown) and the potential on the power feed line VSH1 to each other, and the decoupling capacitor Cd1 and power feed line VSH1 is charged to the memory array power potential Vdds. Since the precharge signal PRE is at an H level, the precharging p-channel transistor 412 is conductive to feed charge from the external power node supplying the external power potential extVdd, and the power feed line VSH0 and the decoupling capacitor Cd0 are charged to the external power potential extVdd.

At time 30, a memory cycle for selecting a memory cell row starts, and the precharge signal PRE falls to an L level. Accordingly, the precharging p-channel transistor 412 becomes nonconductive to stop supply of charge from the external power node.

At time 31, in response to a received address signal, the address selection circuit 600 performs a row selection operation for selecting a row. Accordingly, a word line WL corresponding to an addressed row is selected, and the potential thereof starts to rise up to the level of the boosted voltage Vpp. In accordance with charge retained in the memory cell MC, a very small potential difference dV is generated between the bit lines BL and ZBL.

At time T22, sense amplifier activating signals ZS0P and S0N are each activated, and the sense amplifier driving p-channel transistors SDP0 and SDP01, and the sense amplifier driving n-channel transistor SDN start to be conductive. The sense amplifier SA is activated, and senses and amplifies the very small potential difference dV generated between the bit lines BL and ZBL. At this time, charge required for charging the bit line BL that swings to H data (=Vdds) side is compensated for by charge pre-accumulated in the first power feed line VSH0 and decoupling capacitor Cd0. Since the precharging p-channel transistor 412 is in a nonconductive state, the potential of the first power feed line VSH0 decreases from the level of the external power potential extVdd according to the charge compensating operation.

At time T35, the amplification of the potentials of the bit lines BL and ZBL is substantially completed. The potential of the first power feed line VSH0 attains the level of the memory array power potential Vdds and is equal in potential with the second power feed line VSH1. When the potentials of the power feed lines VSH0 and VSH1 are reduced below the memory array power potential Vdds, the voltage down converting circuit 421 in the second power feed circuit 420 feeds charge thereto. Thereby, the potentials of the power feed lines VSH0 and VSH1 are maintained at the level of the memory array power potential Vdds. The decoupling capacitor Cd1 mainly stores charge that is required to stabilize the potentials of the power feed lines VSH0 and VSH1 after the time T35.

Figure 1:
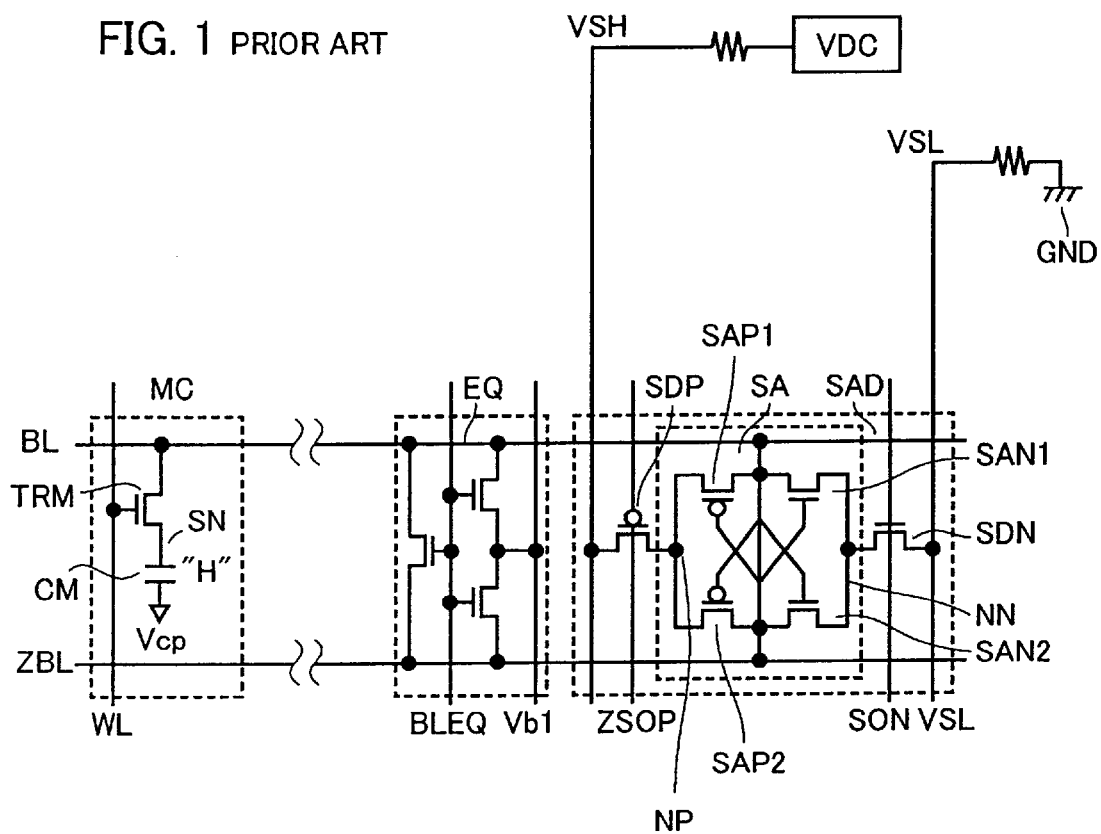
FIG. 1 is a circuit diagram showing a configuration of a conventional DRAM memory array.
Figure 2:
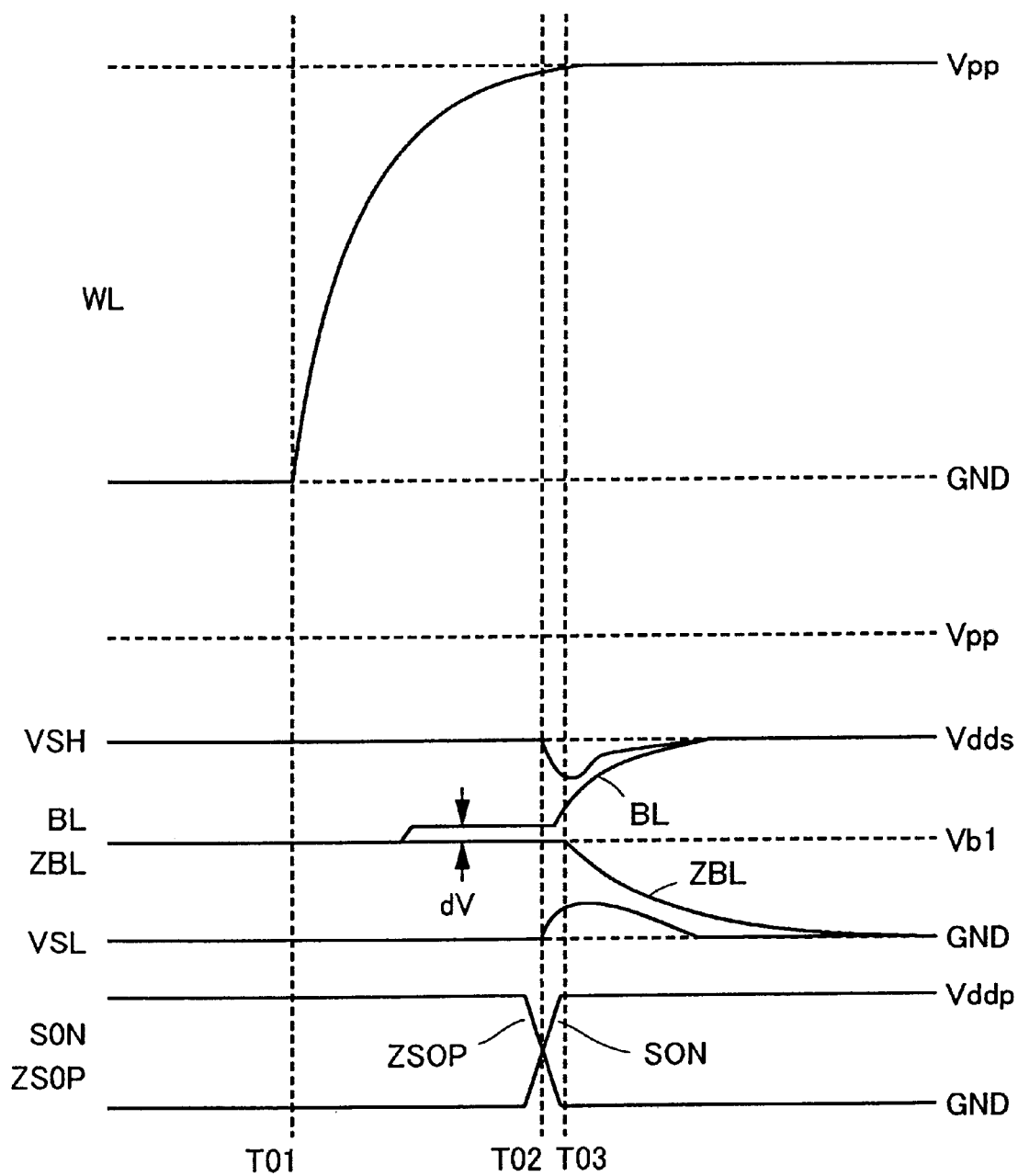
FIG. 2 is a timing chart representing an operation of the sense amplifier SA shown in FIG. 1.
Figure 10:
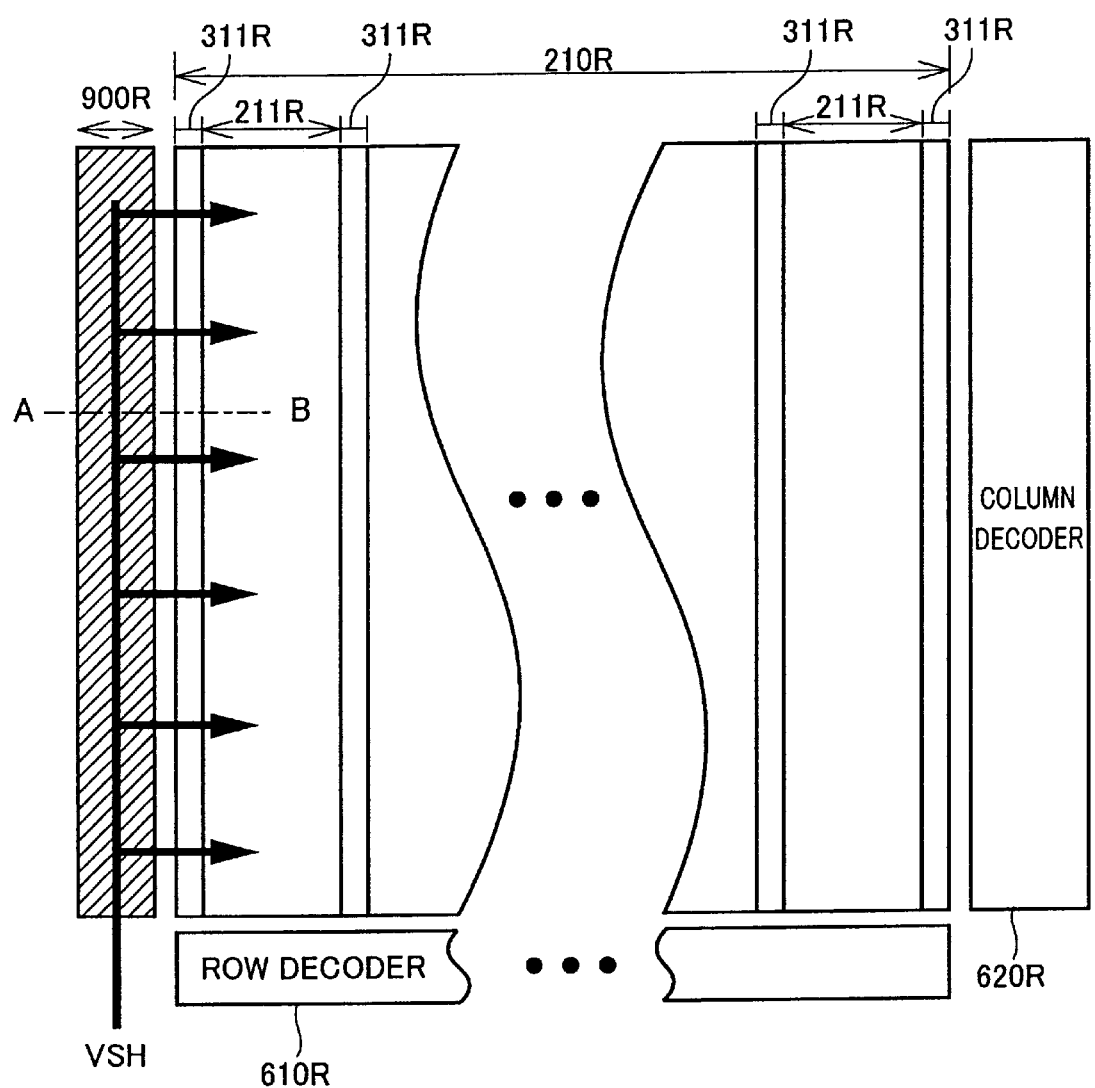
FIG. 10 shows a configuration of a decoupling capacitor in the sense amplifier driving power feed circuit shown in FIG. 7.

FIG. 10 is a diagram schematically showing a layout of the decoupling capacitors Cd0 and Cd1 provided in the sense amplifier driving power feed circuit 400 shown in FIG. 8. In FIG. 10, a row decoder included in the address selection circuit 600 is formed in a region 610R, a column decoder included in the address selection circuit 600 is formed in a region 620R, and the regions 610R and 620R are disposed perpendicularly to each other. The memory array 200 is divided into memory block regions 210R. The memory array 200 shown in FIG. 1 is divided into a plurality of block regions (memory mats) depending on the storage capacity thereof. However, FIG. 10 shows only one memory block region 210R. The memory block region 210R is further divided by a plurality of sense amplifier/driver regions 311R into a plurality of sub-block regions 211R. The sense amplifier/driver circuit SAD is mainly formed in the sense amplifier/drive region 311R. The sense amplifier SA is disposed corresponding to a pair of bit lines disposed in a corresponding sub-block region 21lR. On the other hand, the sense amplifier/driver circuit SAD is disposed corresponding to a predetermined number, one or a plurality, of sense amplifiers SA.

Figure 11:
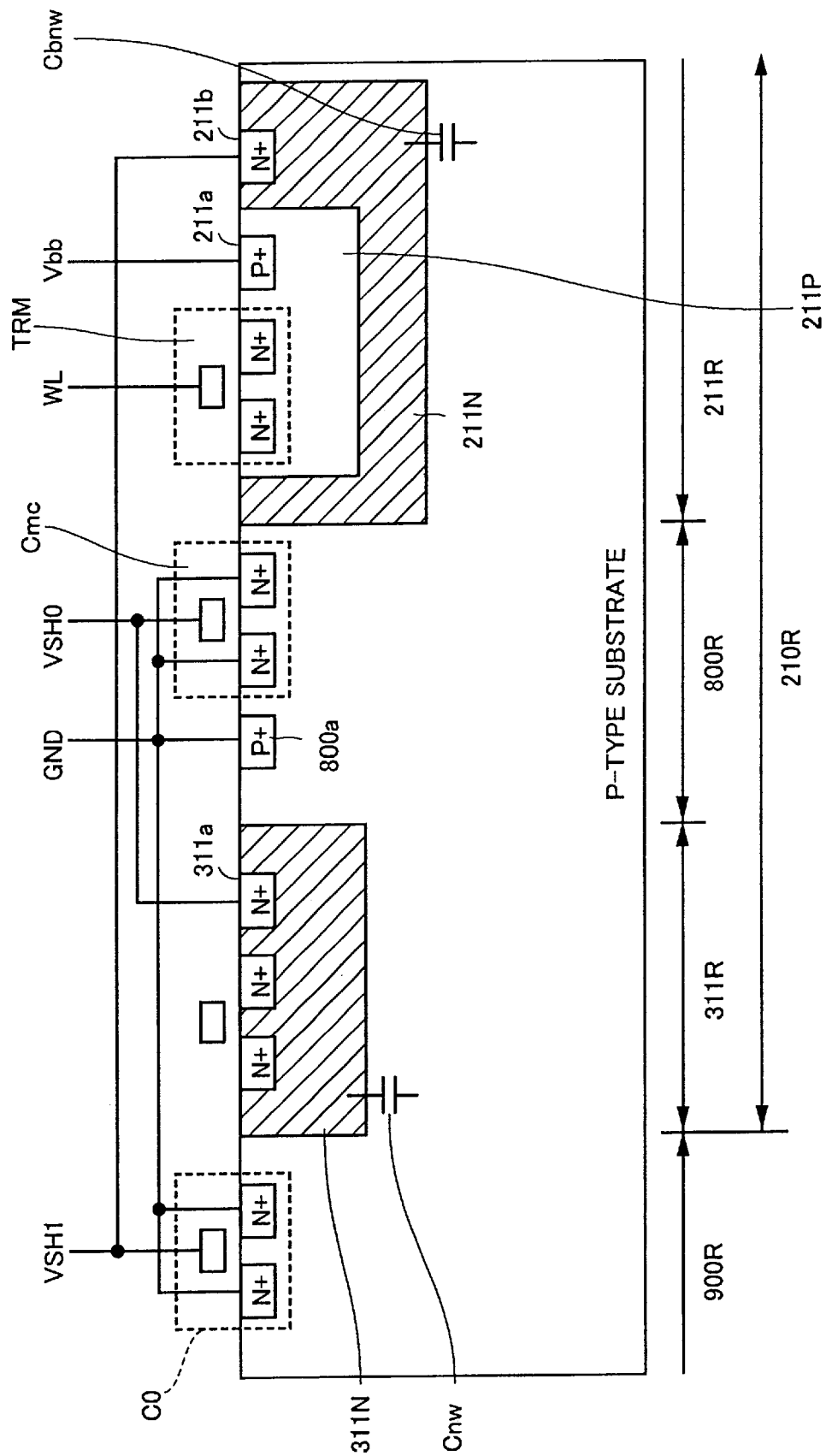
FIG. 11 shows a vertical cross-sectional structure along the line A-B in FIG. 10.

FIG. 11 shows a vertical cross sectional structure along the line A–B in the layout diagram of FIG. 10. In FIG. 11, capacitors Cmc and C0 are formed apart from each other on a surface of a p type semiconductor substrate (p type substrate). The capacitor Cmc is a MOS capacitor formed of a MOS transistor formed in an empty region 800R at a well border between the sub-block region 211R and the sense amplifier/driver region 311R. The capacitor Cmc includes N+ type impurity regions formed apart from each other on the surface of the p type substrate, and a gate electrode formed on a region between these N+ type impurity regions with an insulating film (not shown) laid thereunder. The gate electrode is connected to the first power feed line VSH0. The free space region where the capacitor Cmc is formed is not shown in FIG. 10A. The p type substrate is biased to the ground potential GND through a high density ptype impurity region 800a formed on the surface thereof.

The sense amplifier/driver region 311R is formed in an n-type well 311N formed on the surface of the p type substrate. The sub-block region 211R is formed in a p-type well 211P formed apart from the n-type well 311N on the substrate of the p-type substrate. The p-type well 211P is formed in an n-type well 211N, and is separated from the n-type well 311N. The n-type well 311N is connected to the power feed line VSH0 via a high density n-type impurity region 311a. The p-type well 211P is biased to a bias potential (back gate potential) Vbb via a high density impurity region 211a. The n-type well 211N is connected to the power feed line VSH1 via a high density impurity region 211b.

A junction capacitance Cnw is formed between the n-type well 311N in the sense amplifier/driver region 311R and the p-type substrate. A junction capacitance Cbnw is formed between the bottom N-type well 211N in the sub-block region 211R and the p-type substrate. The capacitor C0 is a MOS capacitor formed of a MOS transistor formed in a peripheral circuitry region 900R in an outside of the memory block region 210R. The capacitor C0 includes N+ type (high density n-type) impurity regions formed on the surface of the p-type substrate, and a gate electrode formed on a region between these N+ type impurity regions with an insulating film (not shown) laid thereunder. The N+ type impurity regions are connected to the ground node, and the gate electrode is connected to the power feed line VSH1.

The capacitors Cmc and Cnw are connected in parallel with each other to the first power feed line VSH0; and the capacitors C0 and Cbnw are connected in parallel with each other to the power feed line VSH1.

Since the decoupling capacitor Cd0 has a role of feeding charge primary at the initial sensing operation stage, it is preferable to provide the decoupling capacitor Cd0 near the memory cells MC and the sense amplifiers SA. Therefore, the decoupling capacitor Cd0 is configured of capacitor Cmc, which is formed of the MOS transistor formed in the free space region 800R on the well border between the sub-block region 211R and the sense amplifier/driver region 311R, and the junction capacitor Cnw, which is formed between the n-type well 311N in the sense amplifier/driver region 311R and the p-type substrate.

The decoupling capacitor Cd1 includes, as main components, the bottom n-type well 211N in the sub-block region 211R and the junction capacitor Cbnw formed on the p-type substrate. In view of suppressing the variations in potentials of the power feed lines VSH0 and VSH1 after start of a sensing operation, it is preferable for the decoupling capacitor Cd1 to have as great a capacitance value as possible. The region of the bottom n-type well 211N is formed surrounding the p-type well 211P in the substrate region of the sub-block region 211R, and therefore occupies a major rate of a DRAM layout area and has a significantly large area. Therefore, without increasing the chip area, the junction capacitance Cbnw can be formed to have a great capacitance value. In addition, for a capacitance compensating for the remaining shortage of the decoupling capacitor Cd1 or a capacitance for fine adjustment, the capacitor C0 of a MOS transistor is formed in the peripheral circuitry region 900R in the outside of the memory block region 210R. With the capacitor C0 having the capacitance value switchable by using a metal mask or the like, the capacitance value of the decoupling capacitor Cd1 can be finely adjusted. For example, a plurality of unit capacitances are pre-formed, and the number of the unit capacitances to be connected to the power feed line is adjusted with a mask interconnection to allow the capacitance value of the MOS capacitor C0 to be adjusted.

Figure 12:
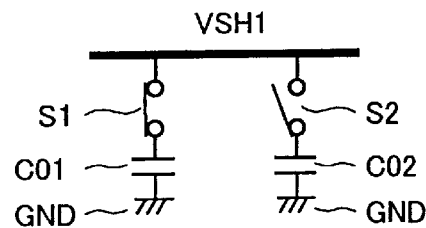
FIG. 12 shows a configuration of capacitor formed in a peripheral circuit portion shown in FIG. 11.

FIG. 12 is a circuit diagram showing a configuration of the MOS capacitor C0.

The MOS capacitor C0 is formed on a layer below the power feed line VSH1 in the peripheral circuitry region 900R shown in FIG. 10. For example, the MOS capacitor C0 is configured as follows. MOS capacitors C01 and C02 are formed in parallel on a layer below the power feed line VSH1, and switches S1 and S2 that are selectively turned on with a metal mask are formed serially with the MOS capacitors C01 and C02, respectively. The switches S1 and S2 are selectively made conductive, and the corresponding MOS capacitors are selectively connected to the power feed line VSH1. According to this configuration, the capacitance value of the MOS capacitor C0 can be finely adjusted.

Referring back to FIG. 11, a region for forming the sense amplifier p-channel transistor in the sense amplifier/driver region 311R is shown. As for the sense amplifier n-channel transistor, it may be formed in the p-type well 211P in the sub-block region 211R, or may be formed in a p-type substrate surface in the region 800R with the area of the region 800R on the well border between the sub-block region 211R and the sense amplifier/driver region 311R secured sufficiently.

As described above, two power feed lines on the higher potential of the sense amplifier are provided, one of the power feed lines is set to the memory array power potential Vdds. The other power feed line is precharged to the external power potential extVdd, which is higher than the memory array power potential Vdds, before a sensing-amplifying operation is started to apply the overdriving method. Thus, the overdriving method can be used to provide auxiliarily contribution to the sensing operation.

In addition, even when the external power potential extVdd is low, the second power feed circuit 420 performs charging in a sensing operation to perform supplementary charging by using the precharged charge. Therefore, reduction in the memory array power potential can be suppressed. In addition, in the sensing operation, the external power node and the first power feed line VSH0 are separated from each other, thereby allowing overcharging to bit lines via the sense amplifier to be prevented. Therefore, the reliability of the memory cell capacitor insulating film is guaranteed.

Furthermore, since charge is fed in the sensing operation according to the overdriving method, the reduction in the sense operation speed can be prevented.

In the arrangement shown in FIG. 8, the common sense amplifier activating signal ZS0P is applied to the two p-channel transistors SDP0 and SDP1 on the high-potential-side of the sense amplifier/driver circuit SAID. However, as shown in FIG. 13, sense amplifier activating signals ZS0P0 and ZS0P1 that are different from each other may be applied to the p-channel transistors SDP0 and SDP1 to allow the activation timing and activation time period of each of the sense amplifier activating signals ZS0P0 and ZS0P1 to vary.

Figure 3:
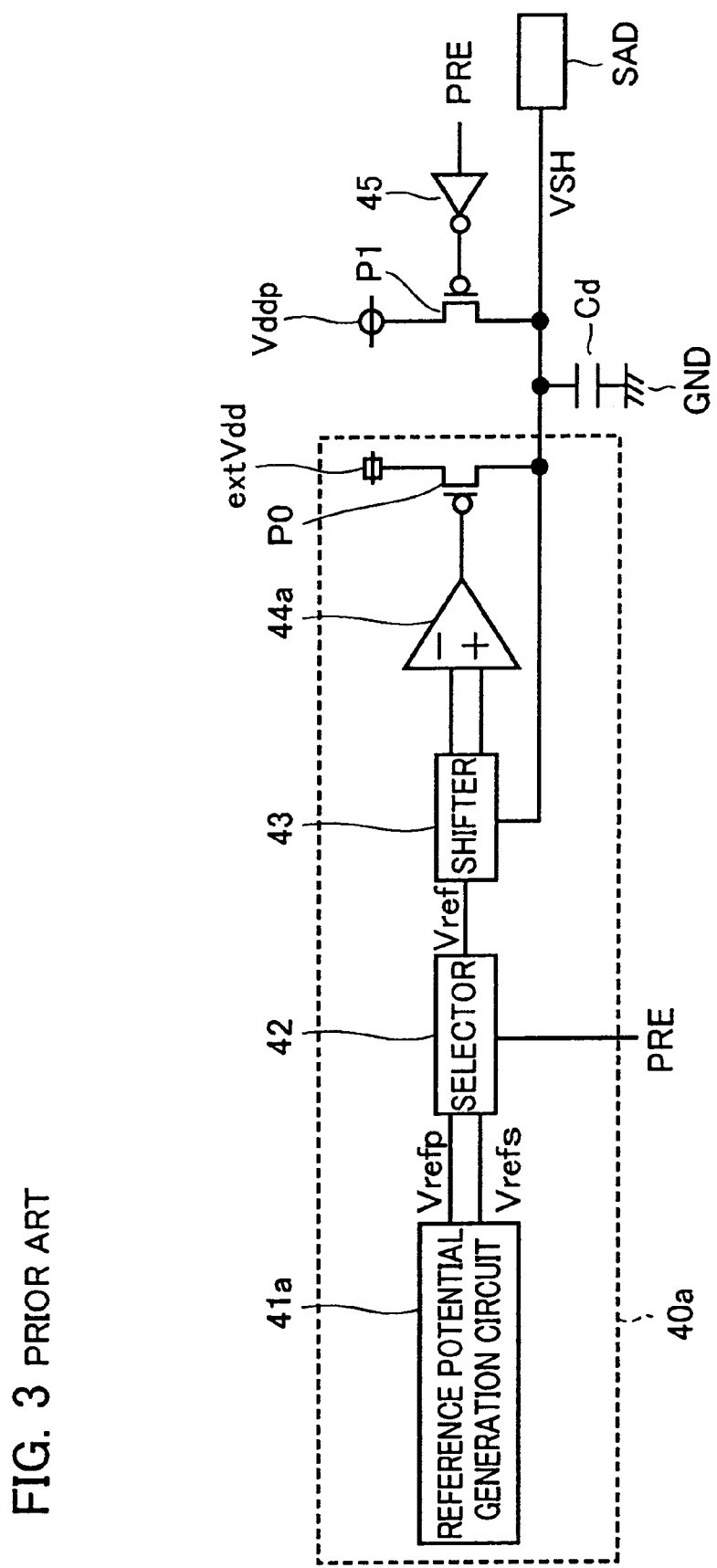
FIG. 3 is a circuit diagram showing a configuration of a circuit for feeding power potential to a higher potential power feed line for driving the sense amplifier according to the conventional overdriving scheme.
Figure 13:
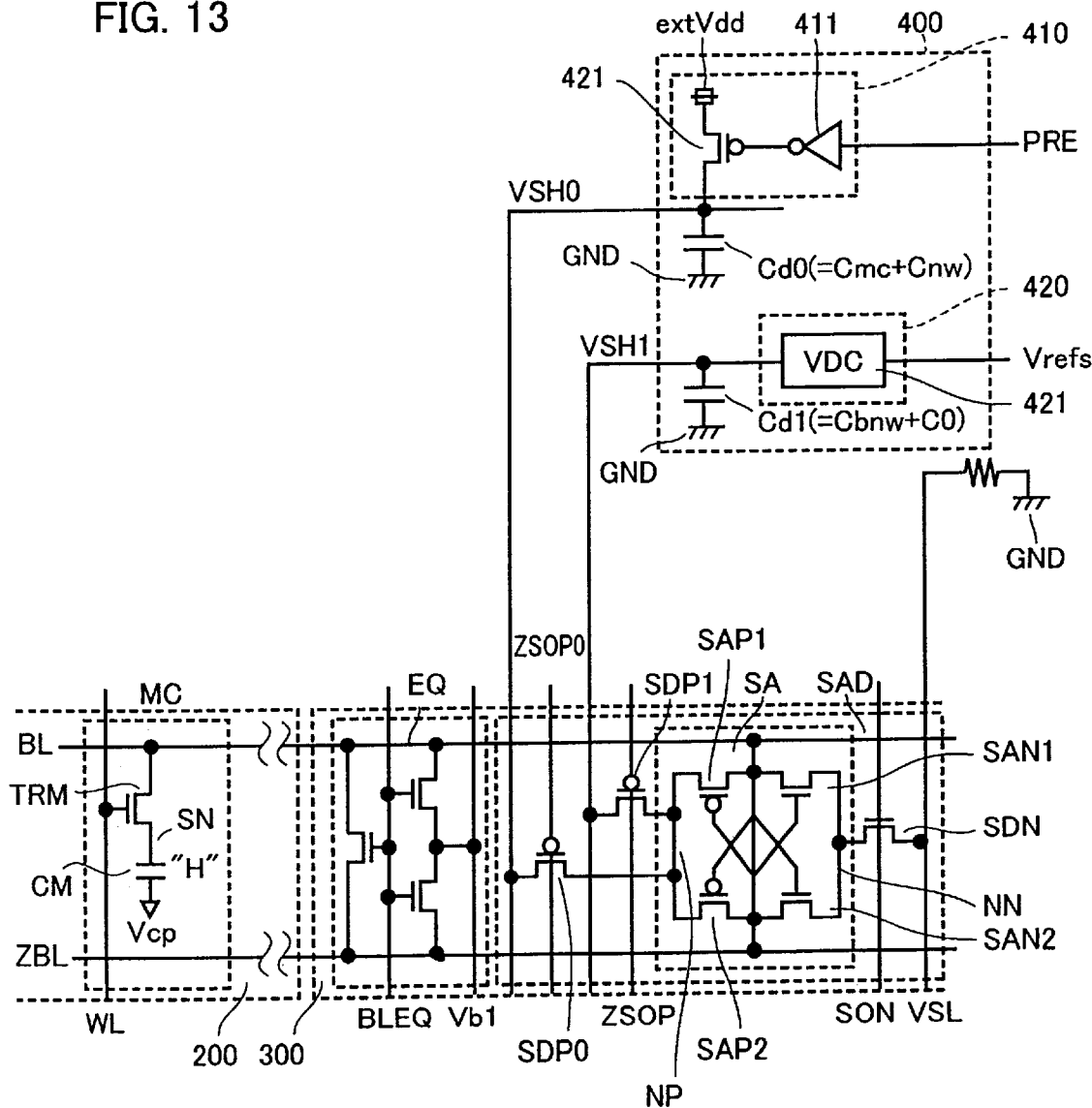
FIG. 13 is a circuit diagram showing another configuration of a sense amplifier driving power feed circuit, a sense amplifier driver/equalize circuit, and a memory array.
Figure 14:
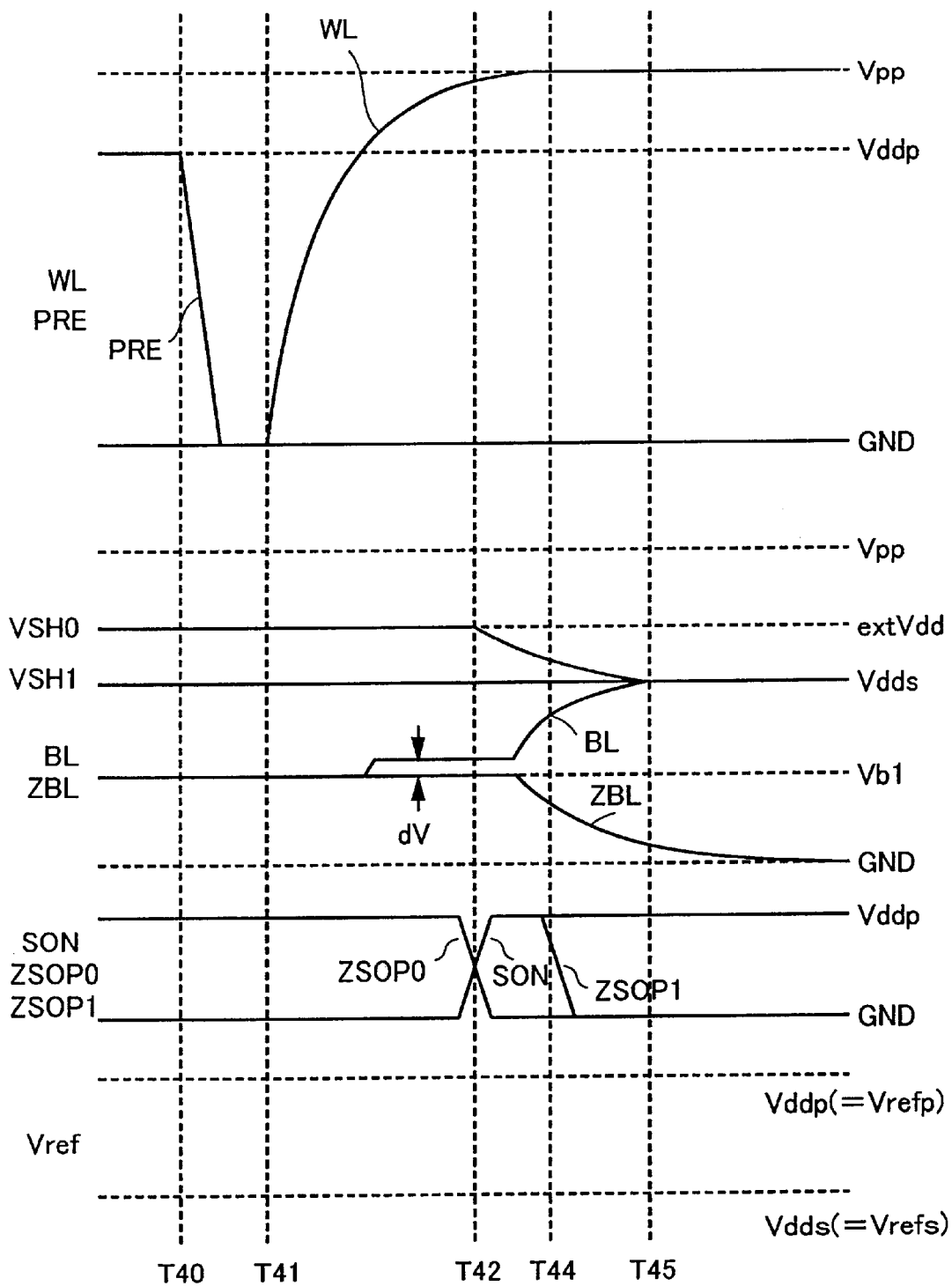
FIG. 14 is a timing chart representing operations of the sense amplifier driving power feed circuit and a sense amplifier/driver circuit SAD as shown in FIG. 13.

FIG. 14 is a timing chart representing operations of the sense amplifier driving power feed circuit 400 and a sense amplifier driver circuit SAD shown in FIG. 13. In FIG. 14, the relationships among the potentials are similar to those shown in FIG. 3.

In a standby state, or before time T40, the voltage down converting circuit 421 operates to equalize a reference potential Vrefs fed from a reference potential generation circuit (not shown) and the power feed line VSH1 to each other, and the power feed line VSH1 and the decoupling capacitor Cd1 are charged to the memory array power potential Vdds. Concurrently, since the precharge signal PRE is at an H level, the precharging p-channel transistor 412 is in conductive state. Thereby, charge is fed from an external power node of the external power potential extVdd via the precharging p-channel transistor 412, and the power feed line VSH0 and the decoupling capacitor Cd0 are charged to the external power potential extVdd.

At time T40, the level of the precharge signal PRE falls to an L level. Accordingly, the precharging p-channel transistor 412 transits to a nonconductive state, to stop charging from the external node supplying the external power potential extVdd.

At time T41, a word line WL is selected, and the potential thereof starts to rise up to the level of the boosted boltage Vpp. In accordance with charge retained in the memory cell MC, a very small potential difference dV is generated between the bit lines BL and ZBL.

At time T42, sense amplifier activating signals ZS0P0 and S0N are each activated and the sense amplifier driving p-channel transistors SDP0 and the sense amplifier driving n-channel transistor SDN start to be conductive. Then, the sense amplifier SA is activated, and it senses and amplifies the very small potential difference dV generated between the bit lines BL and ZBL. At this time, charge required for charging the bit line BL that swings to H data (=Vdds) side is compensated for by charge pre-accumulated in the first power feed line VSH0 and decoupling capacitor Cd0. According to the charge compensating operation, the potential of the first power feed line VSH0 starts to decrease from the level of the external power potential extVdd.

At a time T44, the sense amplifier activating signal ZS0P1 is activated, and responsively the sense amplifier driving p-channel transistor SDP1 is rendered conductive. Through the p-channel transistors SDP0 and SDP1 made conductive, the first power feed line VSH0 and the power feed line VSH1 are electrically connected with each other, and their potentials are converged into the same level.

At time T45, the amplification of the potentials of the bit lines BL and ZBL is substantially completed. Both the potential of the first power feed line VSH0 and the potential of the second power feed line VSH1 are equaled to the level of the memory array power potential Vdds. When the potentials of the power feed lines VSH0 and VSH1 are reduced below the memory array power potential Vdds, the voltage down converting circuit 421 in the second power feed circuit 420 feeds charge thereto. Thus, the potentials of the power feed lines VSH0 and VSH1 are maintained at the level of the memory array power potential Vdds. The decoupling capacitor Cd1 stores charge mainly required to stabilize the potentials of the power feed lines VSH0 and VSH1 after time T45.

As described above, according to the first embodiment, both the power feed line VSH0 subject to overdriving and the power feed line VSH1 not subject to the overdriving are employed, and the time difference is provided in activation timing of the sense amplifier activating signals for electrically connecting these power feed lines. This configuration provides the following advantages. Compared to a configuration in which no time difference is provided for connection of the power feed lines and the sense amplifier, charge stored in the first power feed line VSH0 and the decoupling capacitor Cd0 can be used to charge the bit lines more concentratedly at the initial sensing/amplifying operation stage of the period from the time T43 to T44. Since the period for utilizing the auxiliary role of the overdriving is limited efficiently, the initial sensing/amplifying operation stage can be more speeded up.

In addition, the semiconductor memory device of the first embodiment is configured such that two higher potential sense amplifier power feed lines are provided, and the overdriving method is applied to one of the power feed lines, and the overdriving method is not applied to the other power feed line. Therefore, the configuration allows the overdriving of the higher potential power feed lines to provide auxiliary contribution to the sensing amplifying operation, and also allows the implementation of the sensing-amplifying operation according to the overdriving scheme with less influence of variations in the external power potential extVdd. In addition, even when the external power potential extVdd is somewhat higher than an expected range, and the power feed line with the overdriving scheme and the decoupling capacitor are overcharged, the excessive potential that is applied to the storage node can be substantially mitigated since the overcharged power feed line is electrically connected to the other non-overdriven power feed line.

In addition, even when the external power potential extVdd varies at least within a range allowed on the specification, the decoupling capacitor has the capacitance value set to satisfy the following relationship, to avoid excessive voltage application to the insulating film of the memory cell due to variation to the plus side of the potential of a predetermined power source:

$$Cd0 \times (Vdp - Vdds) < Cba \times Vbl.$$

However, since charge corresponding in amount to charge used in the sensing operation in the initial sensing/amplifying operation stage of the sense amplifier is secured, slow down in the initial sense operation stage can be prevented. In addition, even when variation to the minus side of the predetermined power source potential are significantly great, and charge required for the sense operation cannot be compensated for only by charge stored in the decoupling capacitor Cd0, the remainder of the required charge can be compensated for by the charge stored in the decoupling capacitor Cd1 connected to the second power feed line VSH1 and the voltage down converter (VDC) 421 which feeds the charge thereto. Thus, the potential of the power feed line can be prevented from significantly dropping to the level below the down converted potential of the power feed line.

Furthermore, the capability of avoiding application of excessive potential to the storage node leads to the improvement in reliability of the miniaturized semiconductor memory device for which the break down voltage characteristics of the insulating film is a significantly important factor.

As described above, even in the semiconductor memory device meeting the requirement for low voltage operation and satisfying the relationship of extVdd (external power potential)=Vddp (peripheral circuit power potential), both the speed up of the sensing amplifying operation and the reliability of the memory cell capacitor can be implemented since sufficient gate/source potential Vgs of the p-channel transistor in the sense amplifier can be secured.

In each of the configurations shown FIGS. 8 and 13, two higher potential power feed lines are provided. However, the present invention is not limited thereto, and a plurality of power feed line with the overdriving schemes and a plurality of non-overdriven type power feed line may be provided. Furthermore, in the above described configuration, there is provided the sense amplifier driving transistors corresponding to the individual sense amplifiers. However, the invention is not limited to the described configuration. The sense amplifier driving transistor may be provided in a unit of a group of a plurality of the sense amplifiers.

In addition, in each of the configurations shown FIGS. 8 and 13, the first power feed circuit charges the power feed line VSH0 and the decoupling capacitor Cd0 prior to sensing operation, with the precharging transistor connected between the external power potential extVdd and the first power feed line. However, this is not a limitation of the present invention. For example, a plurality of internal power supplies are provided in the logic merged DRAM. In such a configuration, there may be a case where the DRAM portion must be operated by using an internal power potential that would cause relatively great variations. In this case, the present invention may be applied by providing the precharging transistor between the first power feed line and the internal power potential source, which causes relatively great variations, in place of the external power supply potential.

(Second Embodiment)

Figure 15:
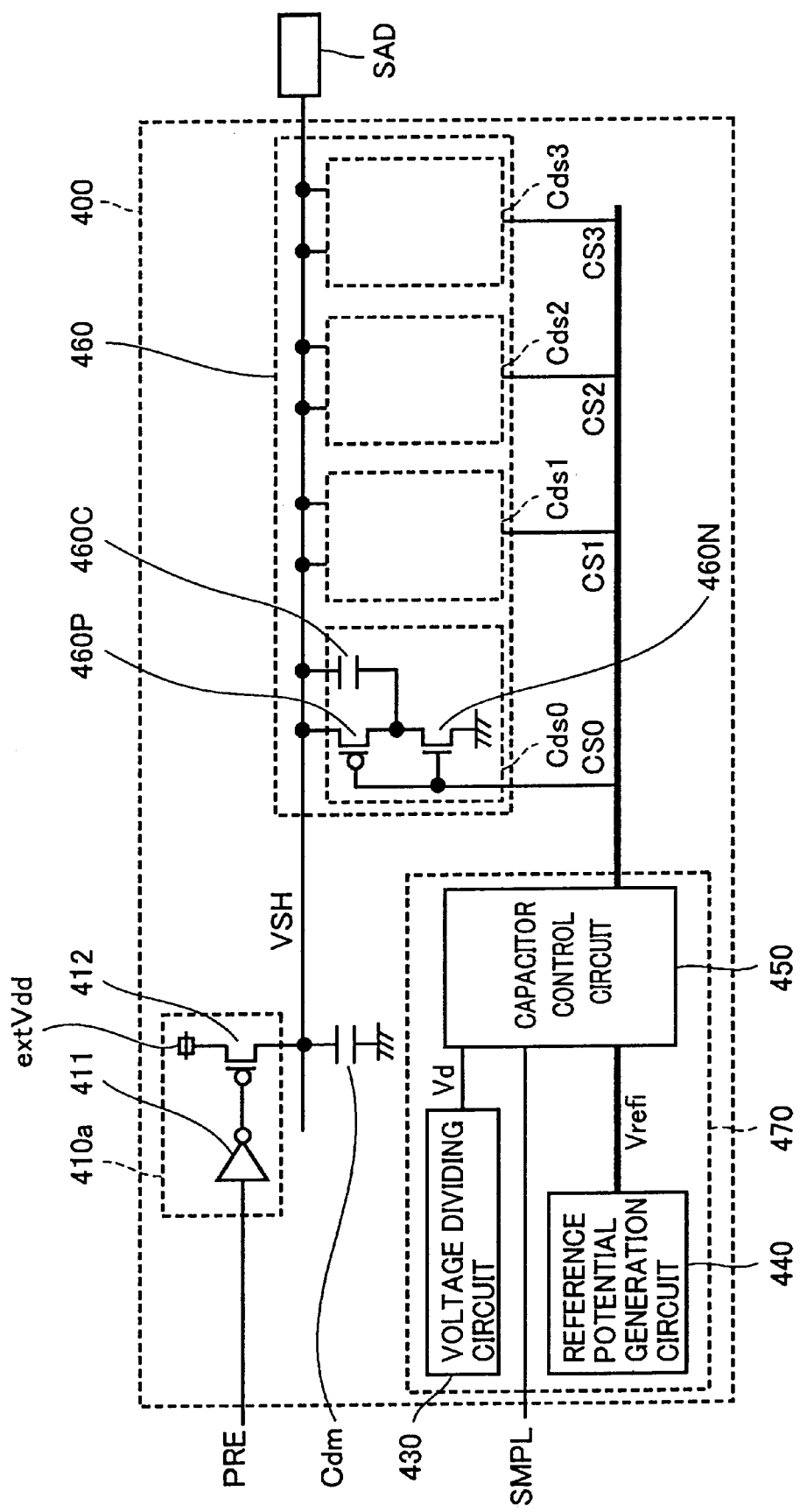
FIG. 15 is a circuit diagram showing a configuration of a sense amplifier driving power feed circuit according to a second embodiment of the present invention.

FIG. 15 is a diagram showing a configuration of a sense amplifier driving power feed circuit 400 according to a second embodiment of the present invention.

The sense amplifier driving power feed circuit 400 includes: a charging circuit 410a for feeding charge from an external power node feeding an external power potential extVdd to a sense amplifier power feed line VSH in response to a precharge signal PRE; a decoupling capacitor Cdm connected between the sense amplifier power feed line VSH and a ground potential GND; a variable decoupling capacitor 460 connected to the sense amplifier power feed line VSH, and having a capacitance value variable in response to a control signal; a voltage dividing circuit 430 for dividing the external power voltage to generate a voltage Vd; a reference potential generator circuit 440 for generating a plurality of reference potentials Vrefi (i=0, 1, 2, and 3) each at a predetermined constant level; and a capacitor control circuit 450 receiving the voltage Vd and the reference potential Vrefi from the voltage dividing circuit 430 and the reference potential generator circuit 440, respectively, to control the capacitance value of the variable decoupling capacitor 460.

The charging circuit 410a includes an inverter 411 receiving and inverting the precharge signal PRE for outputting and a p-channel transistor 412 connected between the external power node and the power feed line VSH, and receiving the output of the inverter 411 on a gate thereof.

The variable decoupling capacitor 460 includes a plurality of discrete capacitor sections Cds0 to Cds3 connected in parallel with each other between the power feed line VSH and a ground node. Each of the discrete capacitor sections Cds0 to Cds3 includes a p-channel transistor 460P, an n-channel transistor 460N, and a decoupling capacitor 460C. The transistors 460P and 460N are connected in series with each other between the power feed line VSH and the ground node that feeds a ground potential GND. The capacitor 460C is connected between a connection node of the transistors 460P and 460N and the power feed line VSH. Each of the MOS transistors 460N and 460P receives a control signal CSi (i=0, 1, 2, or 3) from the capacitor control circuit 450 on their respective gates.

Figure 16:
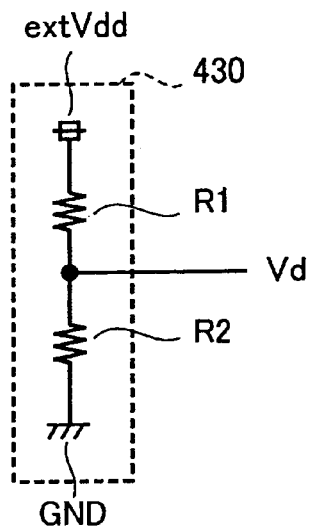
FIG. 16 is a circuit diagram showing a configuration of a voltage dividing circuit shown in FIG. 15.

FIG. 16 is a circuit diagram showing an example of the voltage dividing circuit 430.

The voltage dividing circuit 430 includes resistance elements R1 and R2 connected in series between an external power node and a ground node. The voltage Vd is output from a connection node between the resistance elements R1 and R2. When the voltage division ratio of the resistance elements R1 and R2 is β, the voltage Vd is obtained by $$Vd = \beta \times ext\ Vdd.$$

Preferably, the resistance elements R1 and R2 are each formed of a combination of a pure resistance element and a channel resistance element, so as to be variable for accommodating to a variation in processing and the like. Compared to the reference potential generating circuit 440 (described below), the voltage dividing circuit 430 is configured to reflect any variation in the external power voltage directly on the voltage Vd.

Figure 17:
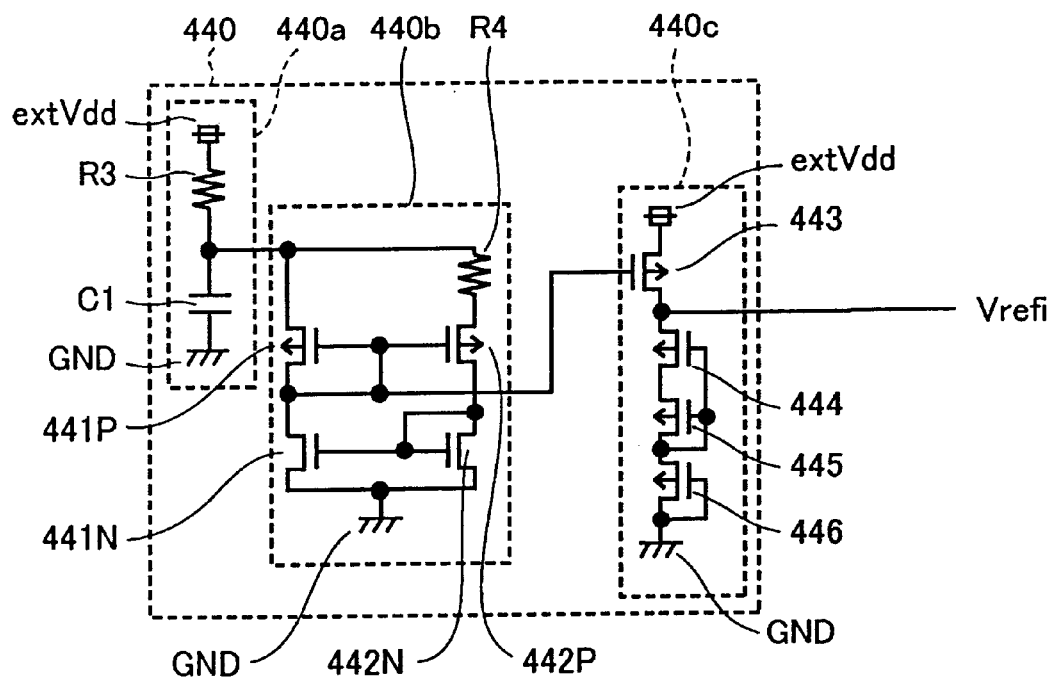
FIG. 17 is a circuit diagram showing a configuration of a reference potential generating circuit shown in FIG. 15.

FIG. 17 shows an example of a configuration of the reference potential generating circuitry 440. The reference potential generation circuitry 440 includes a plurality of the reference potential generation circuits 440 for generating reference potentials at plural levels. However, FIG. 17 shows representatively an example of the reference potential generation circuit, which generates a reference potential Vrefi.

In FIG. 17, the reference potential generation circuit 440 includes: a low pass filter 440a for removing a high frequency noise components from the external power supply potential extVdd; a constant current generation circuit 440b receiving the output potential of the low pass filter 440a as one operational power supply potential to generate a constant current flow; and an output circuit 440c for converting the constant current into a potential to generate the reference potential Vrefi.

The low pass filter 440a includes a resistor R3 and a capacitor C1 connected in series between the external power node and the ground node.

The constant current generation circuit 440b includes two n-channel transistors 441N and 442N having their gates connected together, and connected in parallel to the ground node; a p-channel transistor 441P having a drain connected to the gate and drain of the n-type transistor 441N, and a source connected to an output of the low pass filter 440a; and a p-channel transistor 442P having a gate connected to the gate of the p-channel transistor 441P, a drain connected to the gate and drain of the n-channel transistor 442N, and a source connected to the output of the low pass filter 440 through a resistor R4.

The output circuit 440c includes: a p-channel transistor 443 having the same size as that of the p-channel transistor 441P in the constant current generation circuit 440b, and forming a current mirror with the transistor 441P; p-channel transistors 444 and 445 each having a channel resistance component; and a p-channel transistor 446 having a gate connected to the ground node to have a threshold voltage component, and a sufficiently large size. The gates of the p-channel transistors 444 and 445 are connected to the drain of the p-channel transistor 446.

In reference potential generation circuit 440, when the channel widths of the p-channel transistors 441P and 442P are respectively represented by W1 and W2, the relationship of W1<W2 (the channel lengths thereof are the same with each other) holds, and the size (ratio of the channel width and the channel length, W/L) of each of the n-type transistors 441N and 442N is determined to operate the transistors 441P and 442P in a sub-threshold region. When the difference between potentials of both ends of resistor R4 is represented by ddV, the following expression is established:

$$ddV = k \times T/q \times \ln(W2/W1)\}.$$

Here, k is a Boltzmann constant, T represents an absolute temperature, and q indicates a charge amount of an electron. Since the resistor R4 causes the potential difference ddV, with a current flowing through the resistor R4 being Ir, a constant current Ir represented by the following expression is generated:

$$Ir = ddV/R4.$$

If temperature dependency of the resistance value of the resistor R4 is neglected, the current Ir is proportional to an absolute temperature T, and has positive temperature characteristics.

When the current flowing through the p-channel transistor 441P in the constant current generation circuit 440b is represented by Ir, the same current in amount as the constant current Ir flows through the p-channel transistor 443, which forms the current mirror with the p-channel transistor 441P, and is the same in the channel width and the channel length as the transistor 441P. A channel resistance component of the output circuit 440c inherits the positive temperature characteristics of the current Ir, and a threshold voltage component in the output circuit 440c has negative temperature characteristics. Therefore, by setting these positive temperature and negative temperature characteristics to be balanced with each other, the temperature characteristics of the reference potentials Vrefi (i=1, 2, and 3) can be eliminated to maintain the reference potentials Vrefi (i=1, 2, and 3) that are relatively invariable and stable. In this case, when a combined channel resistance component of the transistors 444 to 446 is represented by Rc, and a threshold voltage of the p-channel transistor 446 is represented by Vthp, the reference potential Vrefi is expressed by $$Vrefi = Ir \cdot Rc + |Vthp|.$$

Figure 18:
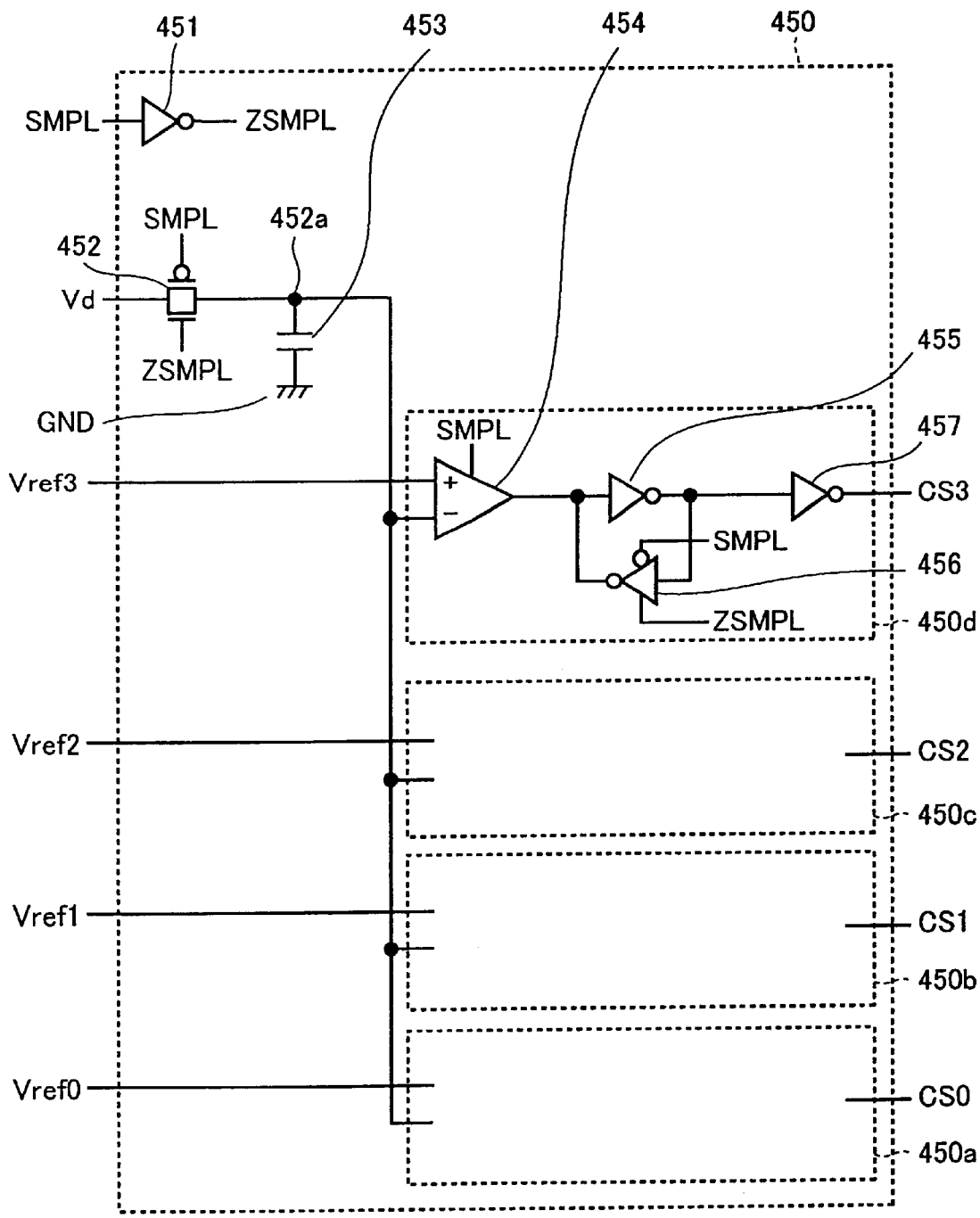
FIG. 18 is a circuit diagram showing a configuration of a capacitor controller circuit shown in FIG. 15.

FIG. 18 is a circuit diagram showing a configuration of a capacitor control circuit 450 shown in FIG. 15.

In FIG. 18, the capacitor control circuit 450 includes; an inverter 451 for generating a complementary signal of a sampling signal SMPL; a transfer gate 452 for taking in a divided potential Vd from the voltage dividing circuit 430 in response to complementary sampling signals SMPL and ZSMPL; a capacitor 453 connected to a node 452a on the output side of the transfer gate 452 to store the divided potential Vd.; and control signal retaining circuits 450a, 450b, 450c, and 450d for comparing the divided potential Vd, which has been taken in through the transfer gate 452, with the reference potentials Vrefi (i=0, 1, 2, and 3) supplied from the reference potential generation circuit 440 to output and retain control signals CSi (i=0, 1, 2, and 3) for controlling the capacitance value of the variable capacitor 460 according to the results of comparison.

Each of the control signal retaining circuits 450a, 450b, 450c, and 450d includes: a comparison circuit 454 activated in response to the sampling signal SMPL; an inverter 455 and a clocked inverter 456 constituting, in combination, a latch section that retains an output signal of the comparison circuit 454 in response to the sampling signal SMPL; and an inverter driver 457 for outputting the control signal CSi (i=0, 1, 2, or 3).

The above-described voltage dividing circuit 430, reference potential generation circuit 440, and capacitor control circuit 450 constitute a monitoring and control circuit 470. The monitoring and control circuit 470 monitors a variation in the external power potential, and controls the capacitance value of the variable decoupling capacitor 460 according to the result of monitoring.

Now, a description will be made of operation of the sense amplifier driving power feed circuit 400 shown in FIG. 15. In the following description, it is assumed that variations in the reference potentials Vrefi (i=0, 1, 2, and 3) are so small as to be neglected, as compared to the variation in the divided potential Vd of the voltage dividing circuit 430, as described above, and that the reference potentials Vrefi (i=0, 1, 2, and 3) satisfy the relationship of Vref0<Vref1<Vref2<Vref3. Also, in the reference potential generation circuit 440 shown in FIG. 17, the reference potentials Vrefi (i=0, 1, 2, and 3) that are different in level from each other are generated through adjustment operation of resistance component ratio of the p-channel transistors 444, 445, and 446.

When the sampling signal SMPL is activated at a predetermined timing, and a sampling period of the external power potential extVdd is set, the transfer gate 452 takes the divided potential Vd from the voltage dividing circuit 430 into the capacitor control circuit 450. In each of the capacitor control circuits 450a, 450b, 450c, and 450d, the clocked inverter 456 is driven to be in an output high impedance state, while the comparison circuit 454 is activated to compare the corresponding reference potential Vrefi (i=0, 1, 2, or 3) with the divided potential Vd (=β×Vdd). When the relation of β×extVdd<Vrefi holds, an output signal of the comparison circuit 454 attains an H level, and accordingly, the control signal CSi attains an H level. In contrast, when the relation of β×extVdd>Vrefi holds, the output signal of the comparison circuit 454 attains an L level, and accordingly, the control signal CSi attains an L level.

For example, when the relationship of Vref1<β×Vdd<Vref2 is assumed to hold, the levels of control signals CS0 to CS3 are as follows: CS0=L level; CS1=L level; CS2=H level; and CS3=H level. In response to the control signals CS0 to CS3, the capacitance value of the variable decoupling capacitor 460 is controlled. Specifically, in FIG. 15, since the control signal CS0 is at an L level, the p-channel transistor 460P in the discrete capacitor section Cds0 is rendered conductive, and two electrode nodes of the capacitor 460C are controlled to be the same in potential. Therefore, the capacitor 460 in the discrete capacitor section Cds0 does not function as a decoupling capacitor. This is true for the discrete capacitor section Cds1 as well. On the other hand, since the control signal CS2 is at an H level, the n-channel transistor 460N in the discrete capacitor section Cds2 becomes conductive. Responsively, the capacitor 460C in the discrete capacitor section Cds2 is connected between the power feed line VSH and the ground node, and functions as a decoupling capacitor. The discrete capacitor section Cds3 is also controlled similarly to the discrete capacitor section Cds2. Accordingly, the total capacitance value of the decoupling capacitors electrically connected to the power feed line VSH is therefore expressed by Cdm+Cds2+Cds3 with the addition of the fixed capacitor Cdm,. Here, the respective capacitance values of the discrete capacitor sections Cds0 to Cds3 are represented by Cds0 to Cds3.

When the above-described total capacitance of the decoupling capacitor is represented by Cd, it is a function of the divided potential Vd, and when Vd=Vref2, the total value satisfies the above-described expression of:

$$Cd \times (Vdp-Vdds) = Cba \times Vbl.$$

Therefore, when Vd<Vref2, charge sufficient for the sensing operation cannot be stored in the capacitor Cd. Such a state occurs in a case in which a range of variation in the power potential is wide, and the step of each of the reference potentials Vrefi (i=0, 1, 2, and 3) is rough, it is essential to appropriately reduce the aforementioned step. Therefore, it is important to appropriately reduce the step of the reference potential Vrefi to suppress such situation. With the reduced step, the decoupling capacitor can be set to accommodate a capacitance value thereof finely to a variation in the power potential, thereby allowing necessary charge to be stored in the decoupling capacitor.

When the sampling signal SMPL is driven to an L level, the transfer gate 452 rendered nonconductive, and the potential of the node 452a is retained by the capacitor 453. On the other hand, the comparison circuit 454 is inactivated and its output is set to a high impedance state, while the clocked inverter 456 is activated. The logic level of the control signal CSi is retained at a level in the sampling period by the clocked inverter 456 and the inverter 455. Further, a transfer gate made conductive when the sampling signal SMPL is at an H level may be disposed between an output of the comparison circuit 454 and an input of the inverter 455.

Setting the capacitance value of the fixed capacitor Cdm relatively great and the capacitance value of each of the discrete capacitor sections Cdsi (i=0, 1, 2, and 3) relatively small would provide the following advantages. The capacitance value of the decoupling capacitor can be finely adjusted, overcharging and charge shortage due to the power potential variation range can be prevented, and an appropriate and optimal decoupling capacitance value can be selected accommodating to variation in the external power supply potential.

Figure 19:
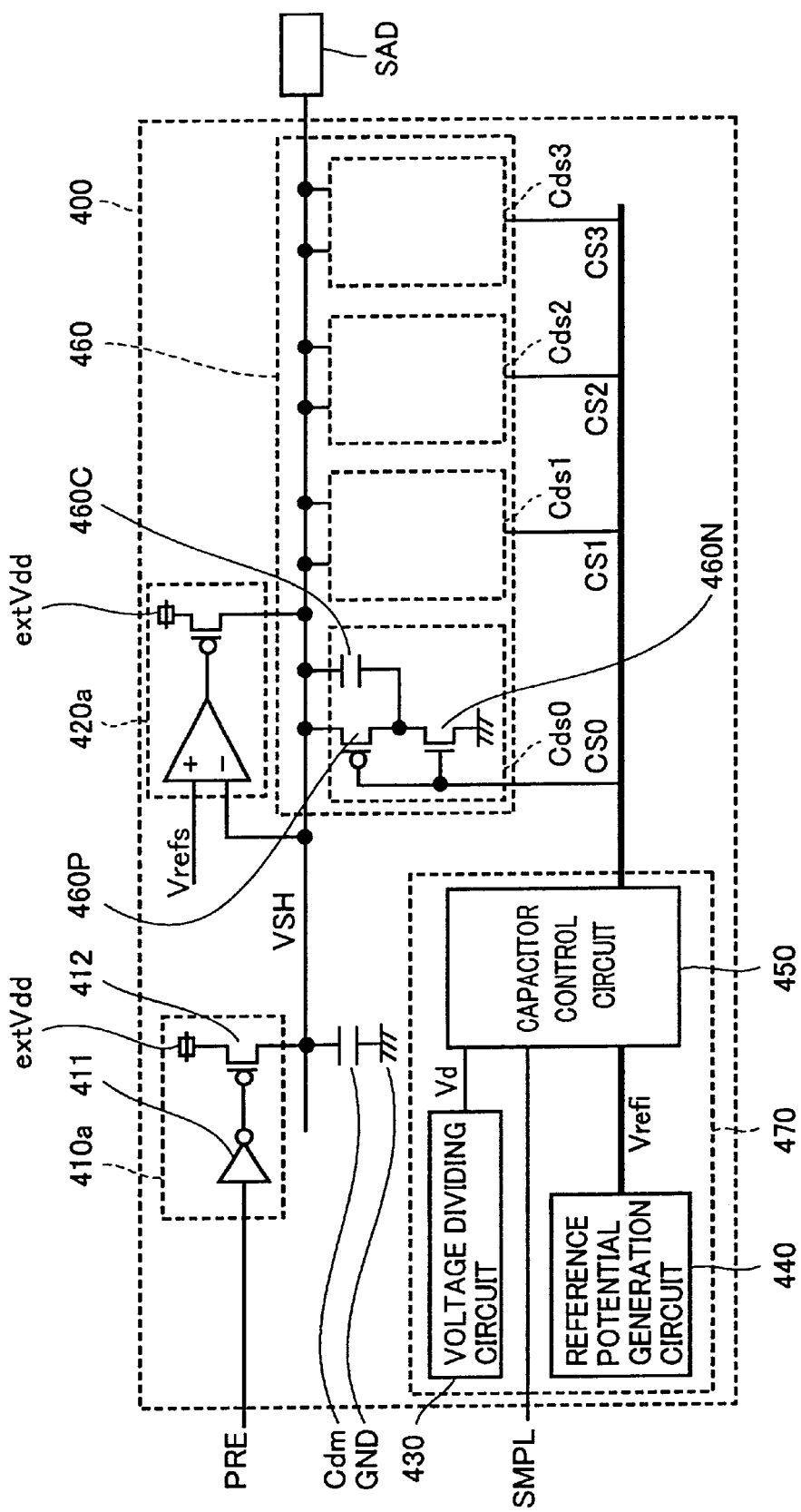
FIG. 19 is a circuit diagram showing a configuration of the sense amplifier driving power feed circuit shown in FIG. 15, additionally including a voltage down converting circuit.

FIG. 19 shows an example of a configuration of the sense amplifier driving power feed circuit 400 of the second embodiment, in which a general voltage down converting circuit VDC is provided.

In the sense amplifier driving power feed circuit 400 shown in FIG. 19, there is provided a voltage down converting circuit 420a that maintain the potential of the power feed line VSH at a potential level Vdds corresponding to the reference potential Vrefs. The voltage down converting circuit 420a attempts to normally maintain the potential on the power feed line VSH at the memory array power potential Vdds obtained by down converting the external power potential extVdd. Other portions of the configuration are the same as those shown in FIG. 15. Therefore, the same reference characters and numerals are used for the corresponding portions, and detailed descriptions thereof will be omitted.

When the potential of the power feed line VSH is reduced below the memory array power potential Vdds, shortage in charge can be compensated for by charge obtained from the voltage down converting circuit 420a. Therefore, by the provision of the voltage down converting circuit 420a, even more stable potential can be fed to the power feed line VSH.

As described above, in the semiconductor memory device of the second embodiment, variation in the external power potential extVdd is detected through the comparison between the divided potential Vd and each of the reference potentials Vrefi (i=0, 1, 2, and 3). When the external power potential extVdd is higher, the capacitance value of the decoupling capacitor is reduced, while the capacitance value of the decoupling capacitor is increased when the external power supply potential is lowered, to normally satisfy the following relationship:

$$Cd \times (Vdp-Vdds) = Cba \times Vbl.$$

Thus, an appropriate capacitance of the decoupling capacitor can be internally set according to the variation in the external power potential.

In addition, when an appropriate decoupling capacitance can be internally set, the dependency of the potential fed to a storage node of a memory cell capacitor through a bit line on the external power potential extVdd can be reduced. Application of an excessive potential to the memory cell storage node can be prevented as well.

Furthermore, when the decoupling capacitor can be set to an appropriate capacitance value for the precharge potential of the power feed line VSH, the overdriving method to precharge the power feed line according to the external power potential extVdd can be utilized, implementing both speed up of the sensing operation and improved reliability of the capacitor insulating film even in the semiconductor memory device conforming to the requirement for low voltage operation.

Furthermore, by the provision of a sampling period for each power-up or for each predetermined period, variation in the external power potential can be periodically detected, and the decoupling capacitance value can be set in accordance with each detection result. In addition, in an attentional operation mode period when a large potential variation is likely to occur, the external power potential can be continuously monitored.

Still furthermore, by setting a period of monitoring variation in the external power potential by the capacitor control circuit, or of the comparison operation by the comparison circuit to a predetermined short period, power consumption of the capacitor control circuit can be saved.

Still furthermore, the arrangement that the capacitor Cdm is disposed in the memory array region, and each of the fine-adjustment capacitor sections Cdsi is formed of a MOS capacitor using a MOS transistor and is disposed in a peripheral circuit region provides the following advantages. Charge required in the initial sensing operation stage can be fed to the sense amplifier adequately. In addition, the potential of the power feed line VSH and the potential of the bit line swinging to the H-level side in the stable period after the sensing and amplifying operation can be precisely controlled to predetermined values.

In the above, while description has been made regarding the configuration with the number of each of the reference potentials Vrefi, the capacitors Cdsi, and the like being four, the invention is not limited to such configuration. The greater the numbers of these components, and the narrower the step range, the finer adjustment can be implemented, and in addition, fine adjustment can be performed with a combination of different capacitance values.

Still furthermore, in the configurations shown in FIGS. 15 and 19, the external power potential extVdd is monitored, and the variable decoupling capacitor is changed in capacitance value in accordance with the variation in the external power potential. However, the present invention is not limited to such operation. A logic merged DRAM or the like includes a plurality of internal power supplies. There may be a case where an internal power supply can not help being greater in potential variation is present, and such noisy internal power supply needs to be used to operate the DRAM portion in the logic merged DRAM. In such a case, precharging can be performed for the power feed line, using the internal power potential instead of the external power potential, and further the variable decoupling capacitor has the capacitance value varied in accordance with the variation in the internal power potential. In this case, however, the internal power potential is required to be higher than the memory cell array power potential.

As described above, in the semiconductor memory device according to the present invention, two higher potential side sense amplifier power feed lines are provided, and one of the feed lines is precharged, prior to the sense amplifier activation, to a potential higher than that of the other feed line. This allows the sensing amplifier operation according to the overdriving scheme with less influence from the variation in the charge potential to be performed, and also allows slow down in the initial sense amplifier operation stage due to a low voltage condition to be prevented.

Furthermore, even when over-precharging is performed due to the potential variation, since two power feed lines are connected together in accordance with the sense amplifier activation, an excessive potential applied on the memory cell storage node can be substantially significantly mitigated.

Still furthermore, the semiconductor memory device according to the present invention allows appropriate decoupling capacitance to be internally set accommodating to variation in the potential of a predetermined power source. Hence, overcharging due to variation in the charging potential can be prevented, and sufficient and appropriate charge amount can be secured in the initial sense amplifier operation stage. Thus, while conforming to the requirement for the low voltage operation, the semiconductor memory device according to the present invention can achieve improvement in both the sensing operation speed and reliability of the insulating film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a pair of bit lines;
   a memory cell connected to either one of said pair of bit lines and storing data;
   a sense amplifier for sensing and amplifying a potential difference of said pair of bit lines, the potential difference being caused in accordance with the data read from said memory cell;
   a first power feed line for supplying a driving power to said sense amplifier;
   a second power feed line for supplying the driving power to said sense amplifier;
   a first sense amplifier driving transistor connected between said first power feed line and said sense amplifier;
   a second sense amplifier driving transistor connected between said second power feed line and said sense amplifier;
   a first decoupling capacitor connected between said first power feed line and a power source providing a power source potential different in logic level from the driving power;
   a second decoupling capacitor connected between said second power feed line and said power source;
   a first power feed circuit for precharging said first power feed line and said first decoupling capacitor to a first potential prior to activation of said sense amplifier; and
   a second power feed circuit for charging said second power feed line and said second decoupling capacitor to a second potential different in level from said first potential.

2. The semiconductor memory device according to claim 1, wherein
   said driving power is for driving one of said pair of bit lines to a potential higher than potential of the other bit line of said pair of bit lines when the data stored in said memory cell is read out, and said second potential is lower than said first potential.

3. The semiconductor memory device according to claim 1, wherein said first power feed circuit charges said first power feed line and said first decoupling capacitor in response to a precharge signal activated when said sense amplifier is in a standby state.

4. The semiconductor memory device according to claim 1, wherein said first sense amplifier driving transistor and said second sense amplifier driving transistor are activated at timings different from each other.

5. The semiconductor memory device according to claim 1, wherein said first sense amplifier driving transistor receives, at a gate thereof, a first sense amplifier activating signal, and said second sense amplifier driving transistor receives, at a gate thereof, a second sense amplifier activating signal activated later than said first sense amplifier activating signal is activated.

6. The semiconductor memory device according to claim 1, wherein said first potential is an external power potential applied externally, and said second power feed circuit comprises a voltage down converting circuit for down converting said external power potential for supply onto said second power feed line.

7. The semiconductor memory device according to claim 1, wherein said first decoupling capacitor is disposed between a region where said sense amplifier is disposed and a region where said memory cell is disposed.

8. The semiconductor memory device according to claim 1, wherein said memory cell and said sense amplifier are disposed in a memory array region, and said second decoupling capacitor is disposed in a peripheral circuit portion outside said memory array region.

9. A semiconductor memory device comprising:

a pair of bit lines;

a memory cell connected to either one of said pair of bit lines and storing data;

a sense amplifier for sensing and amplifying a potential difference between said pair of bit lines, the potential difference being caused in accordance with the data read from said memory cell;

a power feed line for feeding a driving power to said sense amplifier;

a sense amplifier driving transistor connected between said power feed line and said sense amplifier;

a variable decoupling capacitor connected to said power feed line and having a decoupling capacitance value changed in response to a control signal;

a constant decoupling capacitor connected to said power feed line and having a predetermined capacitance;

a charger circuit for charging said power feed line, said constant decoupling capacitor, and said variable decoupling capacitor from a predetermined power source; and a monitoring and controlling circuit for monitoring a potential of said predetermined power source, and generating said control signal according to the result of monitoring to control the capacitance value of said variable decoupling capacitor.

10. The semiconductor memory device according to claim 9, wherein said driving power is for driving one of said pair of bit lines to a potential higher than a potential of the other bit line of said pair of bit lines, in accordance with the data read from said memory cell.

11. The semiconductor memory device according to claim 9, wherein said monitoring and control circuit comprises:

a voltage dividing circuit receiving and dividing a potential of said predetermined power source for supplying a divided potential;

reference potential generation circuitry for generating at least one reference potential at a predetermined potential level; and a capacitor control circuit receiving said divided potential and said reference potential, for comparing said divided potential and said reference potential, and generating and outputting said control signal to control the capacitance value of said variable decoupling capacitor in accordance with the result of comparison.

12. The semiconductor memory device according to claim 11, wherein said reference potential generator circuitry outputs a plurality of reference potentials different in level from each other as said at least one reference potential; and said variable decoupling capacitor comprises discrete capacitor sections not greater in number than said plurality of reference potentials at different levels.

13. The semiconductor memory device according to claim 12, wherein each of said plurality of discrete capacitor sections comprises:

a p-channel transistor and an n-channel transistor connected in series between said power feed line and a power source different from said predetermined power source and receiving a common control signal as said control signal on their respective gates; and a capacitor connected between said power feed line and a connection node between said p-channel transistor and said n-channel transistor.

14. The semiconductor memory device according to claim 11, wherein said reference potential generation circuitry generates a plurality of reference potentials different in potential level from each other as said at least one reference potential, said capacitor control circuit generates a plurality of capacitor controlling signals as said control signal according to the result of comparison between each of said plurality of reference potentials and the potential of said predetermined power source, and said variable decoupling capacitor comprises a plurality of discrete capacitor sections, disposed corresponding to said plurality of capacitor controlling signals, each having a decoupling capacitance value set in accordance with a corresponding capacitor controlling signal.

15. The semiconductor memory device according to claim 14, wherein said capacitor control circuit comprises:

a transfer circuit rendered conductive for a predetermined period for taking in the divided potential obtained through division of the potential of said predetermined power source;

comparison circuits, provided corresponding to said plurality of reference potentials, each for performing a comparison between said divided potential taken in through said transfer circuit and a corresponding reference potential; and control signal retaining circuitry for retaining results of the comparison and outputting the controlling signals for controlling activation of corresponding discrete capacitor sections as said capacitor controlling signals in accordance with said results of the comparison, each of said discrete capacitor sections serving as a decoupling capacitor for said power feed line when activated.

16. The semiconductor memory device according to claim 9, wherein said charger circuit comprises a charging transistor connected between said predetermined power source and said power feed line and stopping charging in accordance with inactivation of a precharge signal, said prechage signal being activated when said sense amplifier is in a standby state.

17. The semiconductor memory device according to claim 16, wherein said predetermined power source is an external power supply receiving an externally applied power supply potential.

18. The semiconductor memory device according to claim 16, further comprising a voltage down converting circuit for down converting the potential of said predetermined power source to feed a resultant down converted potential to said power feed line.

19. The semiconductor memory device according to claim 9, further comprising a fixed decoupling capacitor connected to said power feed line and having a fixed capacitance value.

* * * * *